United States Patent
Jo et al.

(10) Patent No.: US 10,636,886 B2
(45) Date of Patent: Apr. 28, 2020

(54) SEMICONDUCTOR DEVICE

(71) Applicant: Samsung Electronics Co., Ltd., Suwon-si, Gyeonggi-do (KR)

(72) Inventors: Min Seok Jo, Suwon-si (KR); Jae Hyun Lee, Hwaseong-si (KR); Jong Han Lee, Namyangju-si (KR); Hong Bae Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/178,159

(22) Filed: Nov. 1, 2018

(65) Prior Publication Data

US 2019/0305099 A1     Oct. 3, 2019

(30) Foreign Application Priority Data

Mar. 27, 2018   (KR) .................. 10-2018-0034854

(51) Int. Cl.

| | |
|---|---|
| *H01L 27/088* | (2006.01) |
| *H01L 29/417* | (2006.01) |
| *H01L 29/66* | (2006.01) |
| *H01L 21/762* | (2006.01) |
| *H01L 29/06* | (2006.01) |
| *H01L 21/8234* | (2006.01) |
| *H01L 29/78* | (2006.01) |

(52) U.S. Cl.
CPC ...... *H01L 29/41791* (2013.01); *H01L 21/762* (2013.01); *H01L 21/823431* (2013.01); *H01L 29/0653* (2013.01); *H01L 29/66795* (2013.01); *H01L 29/785* (2013.01)

(58) Field of Classification Search
CPC .................. H01L 27/0886; H01L 29/0649
See application file for complete search history.

(56) References Cited

U.S. PATENT DOCUMENTS

| | | |
|---|---|---|
| 8,847,295 B2 | 9/2014 | Shieh et al. |
| 8,946,049 B2 | 2/2015 | Anderson et al. |
| 9,553,171 B2 | 1/2017 | Chang et al. |
| 9,673,300 B2 | 6/2017 | Ha et al. |
| 9,741,823 B1 | 8/2017 | Greene et al. |

(Continued)

FOREIGN PATENT DOCUMENTS

| | | |
|---|---|---|
| KR | 20160045440 | 4/2016 |

*Primary Examiner* — Thomas L Dickey
(74) *Attorney, Agent, or Firm* — Myers Bigel, P.A.

(57) ABSTRACT

A semiconductor device includes a first fin type pattern and a second fin type pattern, which are isolated from each other by an isolating trench, and extend in a first direction on a substrate, respectively, a third fin type pattern which is spaced apart from the first fin type pattern and the second fin type pattern in a second direction and extends in the first direction, a field insulation film on a part of sidewalls of the first to third fin type patterns, a device isolation structure, which extends in the second direction, and is in the isolating trench, a gate insulation support, which extends in the first direction on the field insulation film between the first fin type pattern and the third fin type pattern, a gate structure, which intersects the third fin type pattern, extends in the second direction, and is in contact with the gate insulation support, wherein a height from the substrate to a bottom surface of the gate structure is greater than a height from the substrate to a bottom surface of the gate insulation support.

20 Claims, 45 Drawing Sheets

(56) References Cited

U.S. PATENT DOCUMENTS

| | | |
|---|---|---|
| 9,761,495 B1 | 9/2017 | Xie et al. |
| 9,786,507 B2 | 10/2017 | Anderson et al. |
| 9,799,769 B2 | 10/2017 | Lin |
| 2016/0351565 A1* | 12/2016 | Sung .................. H01L 27/0886 |
| 2017/0084723 A1 | 3/2017 | Greene et al. |
| 2017/0148682 A1 | 5/2017 | Basker et al. |

* cited by examiner

SEMICONDUCTOR DEVICE

This application claims priority from Korean Patent Application No. 10-2018-0034854 filed on Mar. 27, 2018 in the Korean Intellectual Property Office, the disclosure of which is incorporated herein by reference in its entirety.

BACKGROUND

1. Field of the Inventive Concept

The present inventive concept relates to a semiconductor device.

2. Description of the Related Art

One of the scaling techniques used for increasing the density of a semiconductor device is based on forming a multi gate transistor on a substrate in which a multi-channel active pattern (or silicon body) having a fin or nanowire shape is formed. A gate is formed on the surface of the multi-channel active pattern.

Because such a multi gate transistor uses a three-dimensional channel, scaling may be more easily performed. In addition, the current control capability can be improved even if the gate length of the multi gate transistor is not increased. Furthermore, it may be possible to effectively suppress SCE (short channel effect) in which the potential of the channel region is affected by the drain voltage.

SUMMARY

Aspects of the present inventive concept may provide a semiconductor device that may reduce the likelihood of or prevent a short-circuit between the sources/drains of adjacent transistors and includes an isolating insulation pattern, which isolates the gate electrodes adjacent in a longitudinal direction and includes a gate insulation support and a device isolation structure that are formed in the same manufacturing process stage, thereby improving the operating performance and reliability.

The aspects of the present inventive concept are not limited to those mentioned above and other aspects, which are not mentioned, may be understood based on the description below.

According to some embodiments of the present inventive concept, there is provided a semiconductor device comprising a first fin type pattern and a second fin type pattern, which are isolated from each other by an isolating trench, and extend in a first direction on a substrate, respectively, a third fin type pattern which is spaced apart from the first fin type pattern and the second fin type pattern in a second direction and extends in the first direction, a field insulation film on a part of sidewalls of the first to third fin type patterns, a device isolation structure which extends in the second direction, and is in the isolating trench, a gate insulation support, which extends in the first direction on the field insulation film between the first fin type pattern and the third fin type pattern, a gate structure, which intersects the third fin type pattern, extends in the second direction, and is in contact with the gate insulation support, wherein a height from the substrate to a bottom surface of the gate structure is greater than a height from the substrate to a bottom surface of the gate insulation support.

According to some embodiments of the present inventive concept, there is provided a semiconductor device comprising a first fin type pattern and a second fin type pattern, which are isolated from each other by an isolating trench, and extend in a first direction on a substrate, respectively, a third fin type pattern, which is spaced apart from the first fin type pattern and the second fin type pattern in a second direction and extends in the first direction, a field insulation film, which is disposed on a part of sidewalls of the first, second, and third fin type patterns, a device isolation structure comprising a stacked structure, which extends in the second direction and is in the isolating trench, a gate insulation support comprising the stacked structure, which extends in the first direction on the field insulation film between the first fin type pattern and the third fin type pattern, and a gate structure, which intersects the third fin type pattern, extends in the second direction, and is in contact with the gate insulation support.

According to some embodiments of the present inventive concept, there is provided a semiconductor device comprising a first fin type pattern and a second fin type pattern each extending in a first direction on a substrate, a third fin type pattern spaced apart from the first fin type pattern and the second fin type pattern in a second direction and extending in the first direction, a field insulation film on a part of sidewalls of the first, second, and third fin type patterns, an isolating insulation pattern, which comprises a first isolation pattern extending in the first direction and a second isolation pattern extending in the second direction on the substrate, the first isolation pattern being on the field insulation film between the first fin type pattern and the third fin type pattern, and the second isolation pattern isolating the first fin type pattern and the second fin type pattern, a first gate structure, which intersects the first fin type pattern, extends in the second direction, and is in contact with the first isolation pattern, a second gate structure, which intersects the third fin type pattern, is arranged side by side with the first gate structure, and is in contact with the first isolation pattern, wherein a depth from an upper surface of the first fin type pattern to a bottom surface of the second isolation pattern is greater than a depth from the upper surface of the first fin type pattern to a bottom surface of the first isolation pattern.

It is noted that aspects of the inventive concepts described with respect to one embodiment, may be incorporated in a different embodiment although not specifically described relative thereto. That is, all embodiments and/or features of any embodiment can be combined in any way and/or combination. These and other aspects of the inventive concepts are described in detail in the specification set forth below.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
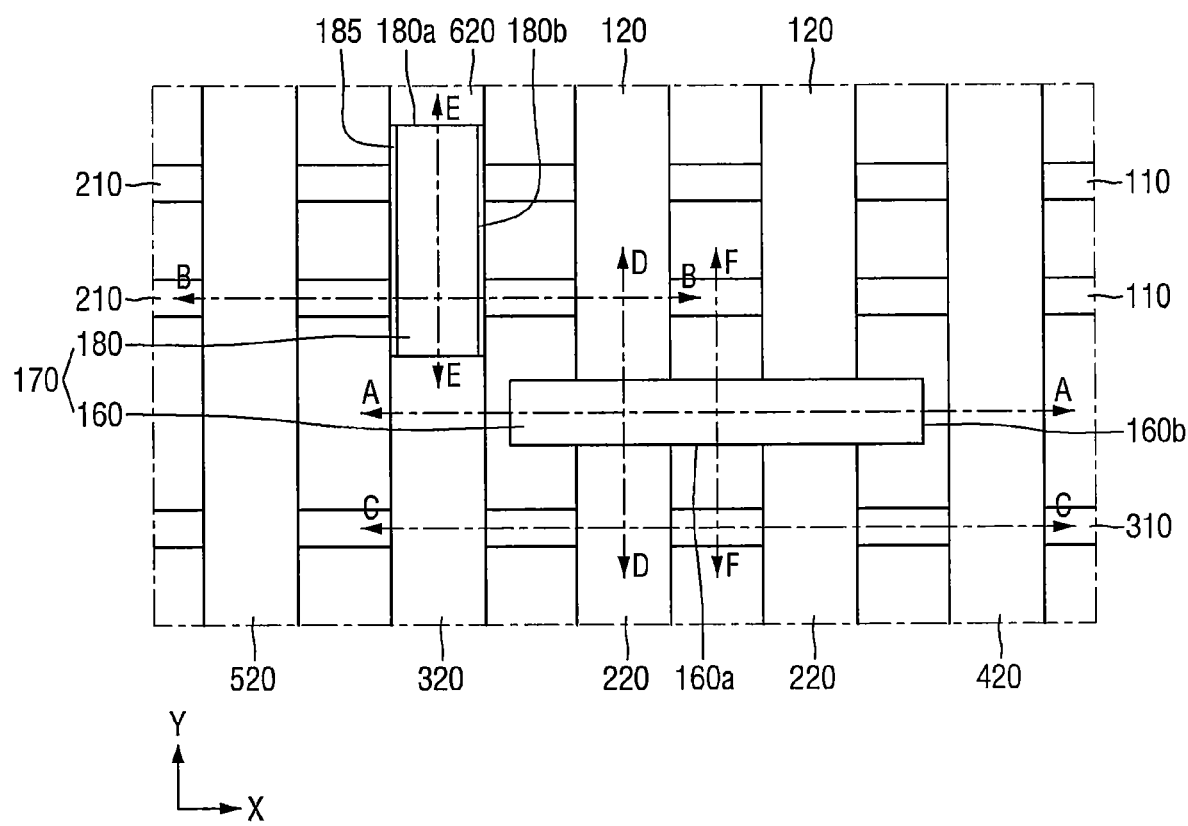
FIG. 1 is a plan view diagram that illustrates a semiconductor device according to some embodiments of the present inventive concept.

In the drawings of the semiconductor device according to some embodiments of the present inventive concept, a fin type transistor (FinFET) including a channel region having a fin type pattern shape is illustrated by way of example, but embodiments of the present inventive concept is not limited thereto. A semiconductor device according to some embodiments of the present inventive concept may include a tunneling transistor (FET), a transistor including a nanowire, a transistor including a nano-sheet, or a three-dimensional (3D) transistor. In addition, a semiconductor device according to some embodiments of the present inventive concept may include a bipolar junction transistor, a lateral double diffused transistor (LDMOS), or the like.

Some embodiments of the inventive concept stem from a realization that short-circuits between the sources/drains of adjacent transistors can be reduced or prevented through use of an isolating insulation pattern that may include a gate insulation support extending in a first direction and a device isolation structure extending in a second direction generally perpendicular to the first direction. The gate insulation support and the device isolation structure may be formed in the same manufacturing process stage.

FIGS. 1 through 7 are diagrams that illustrate a semiconductor device according to some embodiments of the present inventive concept. FIG. 1 is a schematic plan view illustrating a semiconductor device according to some embodiments of the present inventive concept. FIGS. 2 through 7 are cross-sectional view diagrams taken along the lines A-A, B-B, C-C, D-D, E-E and F-F of FIG. 1, respectively. For convenience of explanation, a lower interlayer insulation film 191 and an upper interlayer insulation film 192 are not illustrated in FIG. 1.

Referring to FIGS. 1 to 7, a semiconductor device, according to some embodiments of the present inventive concept, includes a first fin type pattern 110, a second fin type pattern 210, a third fin type pattern 310, a first gate structure 120, a second gate structure 220, a third gate structure 320, a fourth gate structure 420, a fifth gate structure 520, a sixth gate structure 620, and an isolating insulation pattern 170.

The substrate 100 may be a bulk silicon or a silicon-on-insulator (SOI) substrate. Alternatively, the substrate 100 may be a silicon substrate or may include, but is not limited to, other materials, such as silicon germanium, silicon germanium on insulator (SGOI), indium antimonide, lead tellurium compound, indium arsenide, phosphide indium, gallium arsenide, or gallium antimonide.

Each of the first to third fin type patterns 110, 210, and 310 may protrude from the substrate 100. Each of the first to third fin type patterns 110, 210, and 310 may extend long on the substrate 100 along the first direction X. For example, each of the first to third fin type patterns 110, 210, and 310 may include a long side extending in the first direction X, and a short side extending in the second direction Y.

The first and second fin type patterns 110 and 210 may be arranged in a row along the first direction X. The first fin type pattern 110 and the second fin type pattern 210 may be isolated by an isolating trench 180t. The first fin type pattern 110 and the second fin type pattern 210 may be isolated by an isolating insulation pattern 170 extending in the second direction Y. The first fin type pattern 110 may be spaced apart from the second fin type pattern 210 in the first direction X. Each of the first and second fin type patterns 110 and 210 may be spaced apart from the third fin type pattern 310 in the second direction Y. Although each of a plurality of first and second fin type patterns 110 and 210 has been illustrated, embodiments of the inventive concept are not limited thereto.

The first to third fin type patterns 110, 210, and 310 may be a part of the substrate 100, and may include an epitaxial layer that is grown from the substrate 100. The first to third fin type patterns 110, 210, and 310 may include, for example, silicon or germanium, which is an element semiconductor material. Each of the first to third fin type patterns 110, 210, and 310 may include a compound semiconductor, and may include, for example, a IV-IV group compound semiconductor or a III-V group compound semiconductor. Specifically, taking the IV-IV group compound semiconductor as an example, each of the first to third fin type patterns 110, 210, and 310 may be a binary compound or a ternary compound containing at least two or more of carbon (C), silicon (Si), germanium (Ge), and Tin (Sn), or a compound obtained by doping these elements with a group IV element. Taking the group III-V compound semiconductor as an example, each of the first to third fin type patterns 110, 210, and 310 may be a binary compound, a ternary compound, or a quaternary compound formed by combining at least one of aluminum (Al), gallium (Ga) and indium (In) as a group III element with at least one of phosphorus (P), arsenic (As) and antimonium (Sb) as a group V element.

The field insulation film 105 may be formed on the substrate 100. The field insulation film 105 may cover a part of the first and second fin type patterns 110 and 210. For example, the field insulation film 105 may be disposed on a part of the sidewalls of each of the first to third fin type patterns 110, 210, and 310. The upper surfaces of the first to third fin type patterns 110, 210, and 310 may protrude upward from the upper surface of the field insulation film 105. The first to third fin type patterns 110, 210, and 310 may be defined by the field insulation film 105 on the substrate 100. The field insulation film 105 may include, for example, at least one of a silicon oxide film, a silicon nitride film, and a silicon oxynitride film.

Each of the first to sixth gate structures 120, 220, 320, 420, 520, and 620 may extend in the second direction Y on the field insulation film 105, respectively. The first gate structure 120 may be formed on the first fin type pattern 110 to intersect with the first fin type pattern 110. The second gate structure 220 may be formed on the third fin type pattern 310 to intersect with the third fin type pattern 310. The first and second gate structures 120 and 220 may be arranged in a row along the second direction Y with the isolating insulation pattern 170 interposed therebetween. The first and second gate structures 120 and 220 may be isolated from each other by an isolating insulation pattern 170 extending in the first direction X.

The third gate structure 320 may be formed on the third fin type pattern 310 to intersect with the third fin type pattern 310. The third gate structure 320 may be spaced apart from the second gate structure 220 in the first direction X. The third and sixth gate structures 320 and 620 may be arranged in a row along the second direction Y with the isolating insulation pattern 170 interposed therebetween. The fourth gate structure 420 may be formed on the first and third fin type patterns 110 and 310 to intersect with the first and third fin type patterns 110 and 310. The fifth gate structure 520 is formed on the second and third fin type patterns 210 and 310 to intersect with the second and third fin type patterns 210 and 310.

Each of the first to fifth gate structures 120, 220, 320, 420, and 520 may include gate electrodes 130, 230, 330, 430, and 530, gate insulation films 135, 235, 335, and 435, gate spacers 140, 240, 340, 440, and 540, gate trenches 140t, 240t, 340t, 440t, and 540t defined by the gate spacers 140, 240, 340, 440, and 540, and capping patterns 145, 245, 345, 445, and 545.

The first to fifth gate insulation films 135, 235, 335, 435, and 535 may extend along the sidewalls and the bottom surfaces of the respective gate trenches 140t, 240t, 340t, 440t, and 540t. Each of the first to fifth gate insulation films 135, 235, 335, 435, and 535 may include a high dielectric constant insulating film.

The high dielectric constant insulating film may include a high dielectric material having a dielectric constant higher than that of a silicon oxide film. Each of the first to fifth gate insulation films 135, 235, 335, 435, and 535 may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The first to fifth gate electrodes 130, 230, 330, 430, and 530 may be disposed on the respective gate insulation films 135, 235, 335, 435, and 535. The first to fifth gate electrodes 130, 230, 330, 430, and 530 may fill a part of the gate trenches 140t, 240t, 340t, 440t, and 540t, respectively.

The first to fifth gate electrodes 130, 230, 330, 430, and 530 may include, for example, titanium nitride (TiN), tantalum carbide (TaC), tantalum nitride (TaN), titanium silicon nitride (TiSiN), tantalum silicon nitride (TaAlN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof.

The first to fifth gate spacers 140, 240, 340, 440, and 540 may be formed on the sidewalls of the first to fifth gate electrodes 130, 230, 330, 430 and 530, respectively. The first to fifth gate spacers 140, 240, 340, 440, and 540, may include, for example, one or more of silicon nitride (SiN), silicon oxynitride (SiON), silicon oxide ($SiO_2$) and silicon oxycarbonitride (SiOCN).

The first to fifth capping patterns 145, 245, 345, 445, and 545 are formed on the gate electrodes 130, 230, 330, 430, and 530, respectively. The first to fifth capping patterns 145, 245, 345, 445, and 545 may fill the gate trenches 140t, 240t, 340t, 440t, and 540t which are left after formation of the gate electrodes 130, 230, 330, 430, and 530, respectively.

Each of the first to fifth capping patterns 145, 245, 345, 445, and 545 may include, for example, one or more of silicon oxide ($SiO_2$), silicon nitride (SiN), silicon oxynitride (SiON), silicon carbonitride (SiCN) and silicon oxycarbonitride (SiOCN).

Figure 2:
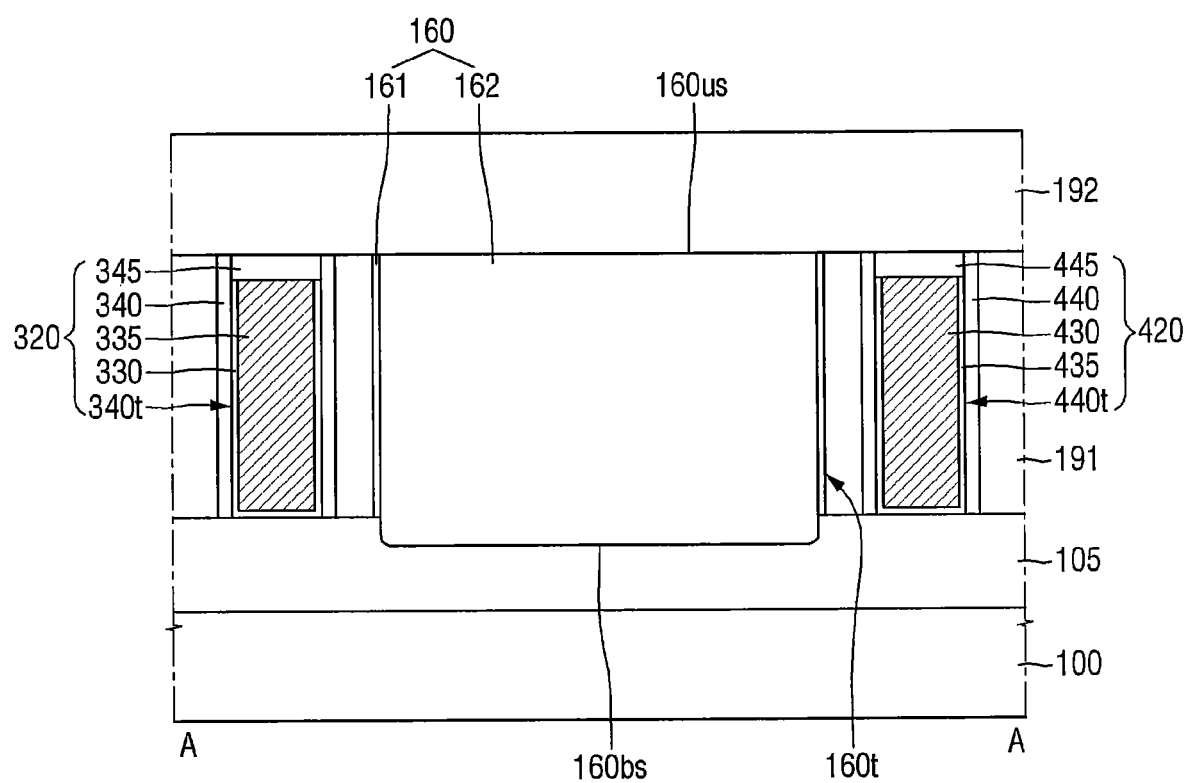
FIGS. 2 through 7 are cross-sectional view diagrams taken along the lines A-A, B-B, C-C, D-D, E-E and F-F of FIG. 1, respectively.
Figure 3:
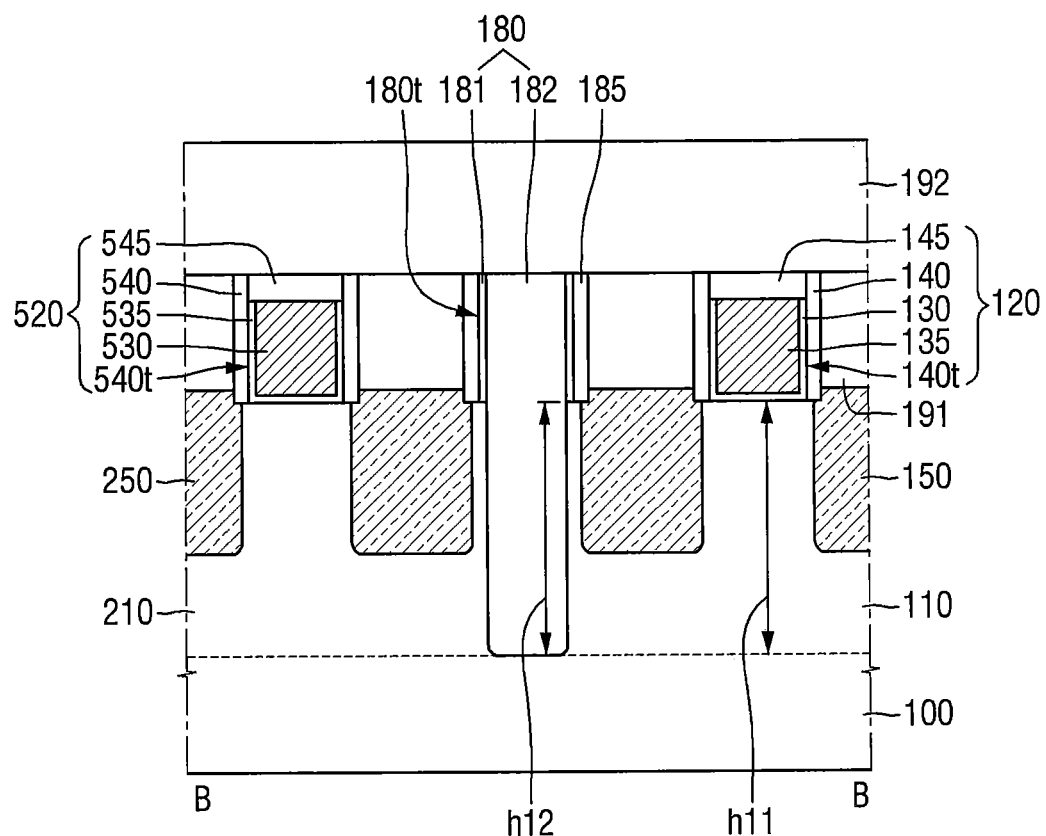
Figure 4:
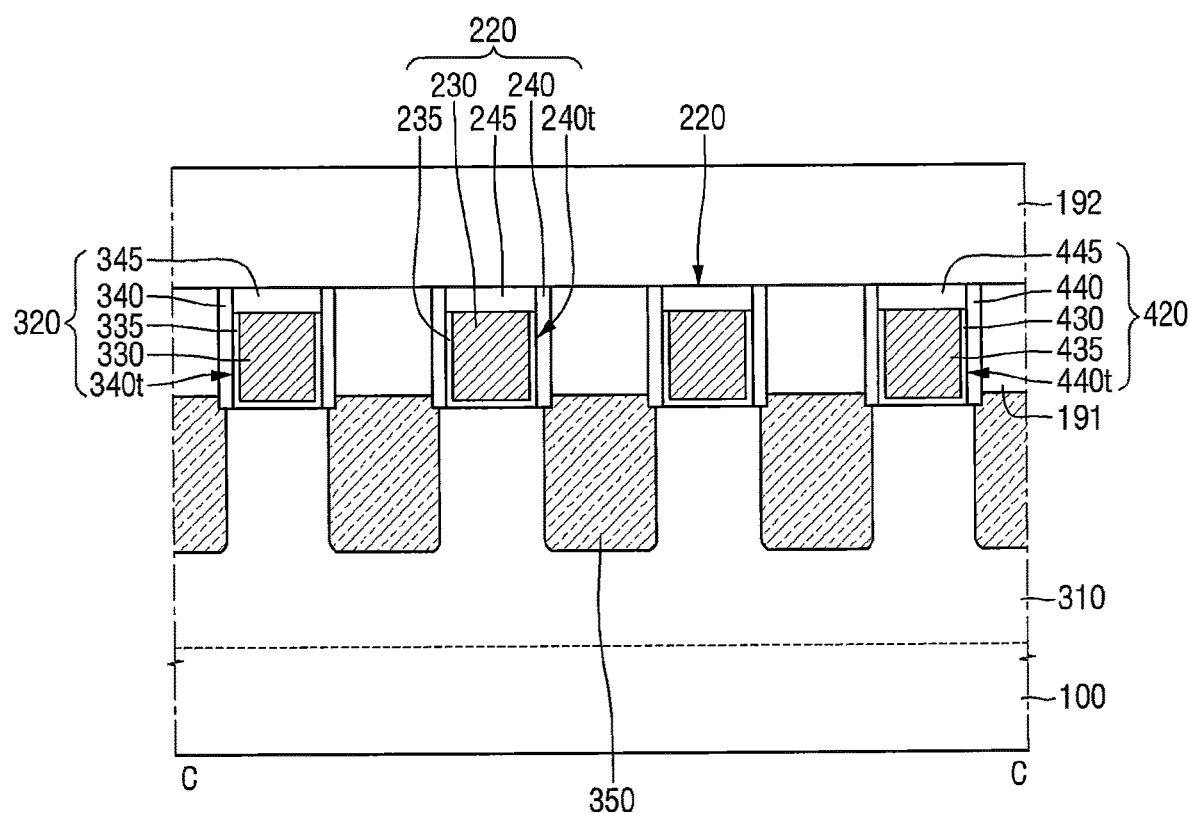

In FIGS. 2 to 4, the first to fifth gate insulation films 135, 235, 335, 435, and 535 are illustrated as not extending between the first to fifth capping patterns 145, 245, 345, 445, and 545 and the first to fifth gate spacer 140, 240, 340, 440, and 540, but embodiments of the inventive concept are not limited thereto.

The sixth gate structure 620 may also include a sixth gate electrode 630, a sixth gate insulation film 635, a sixth capping pattern 645, a sixth gate spacer, and a sixth gate trench. The description of the sixth gate structure 620 may be substantially the same as the description of the first gate structure 120.

A first epitaxial pattern 150 may be formed on the first fin type pattern 110. A second epitaxial pattern 250 may be formed on the second fin type pattern 210. A third epitaxial pattern 350 may be formed on the third fin type pattern 310.

The first epitaxial pattern 150 may be included in the source/drain of the transistor, which uses the first fin type pattern 110 as a channel region. The second epitaxial pattern 250 may be included in the source/drain of the transistor, which uses the second fin type pattern 210 as a channel region. The third epitaxial pattern 350 may be included in the source/drain of the transistor, which uses the third fin type pattern 310 as a channel region.

Although not illustrated, an etching prevention film may be further formed on the first to third epitaxial patterns 150, 250, and 350.

The lower interlayer insulation film 191 may be formed on the field insulation film 105 to cover the first to third epitaxial patterns 150, 250, and 350 in whole or in part. The lower interlayer insulation film 191 may be formed around the first to sixth gate structures 120, 220, 320, 420, 520, and 620. The lower interlayer insulation film 191 may cover at least a part of sidewalls of the first to sixth gate structures 120, 220, 320, 420, 520, and 620.

The isolating insulation pattern 170 may include a first gate insulation support 160 extending in the first direction X, and a first device isolation structure 180 extending in the second direction Y.

The first gate insulation support 160 may be disposed on the field insulation film 105 between the first fin type pattern 110 and the third fin type pattern 310. The first gate insulation support 160 may be spaced apart from the first and third fin type patterns 110 and 310 in the second direction Y. The first gate insulation support 160 may be disposed between the first gate structure 120 and the second gate structure 220. The first gate insulation support 160 may isolate the first gate structure 120 and the second gate structure 220 from each other.

The first gate insulation support 160 may be in contact with the first gate structure 120 and the second gate structure 220. The first gate insulation support 160 includes a first side 160a extending in the first direction X, and a second side 160b extending in the second direction Y. The first and second gate structures 120 and 220 may be in contact with the first side 160a of the first gate insulation support. In FIGS. 1 and 2, the first gate insulation support 160 is illustrated as not being in contact with the third and fourth gate structures 320 and 420, but embodiments of the inventive concept are not limited thereto.

The first gate insulation support 160 may be disposed inside the first insulation trench 160t included in the lower interlayer insulation film 191. A part of the first insulation trench 160t is indented into the field insulation film 105. The sidewalls of the first insulation trench 160t may be defined by the lower interlayer insulation film 191 and the field insulation film 105. At least a part of the bottom surface of the first insulation trench 160t may be defined by the field insulation film 105.

The first gate insulation support 160 may fill the first insulation trench 160t. The first gate insulation support 160 may include a first gate insulation liner 161 and a first gate insulation filling film 162. The first gate insulation liner 161 extends along a part of the sidewall of the first insulation trench 160t. The first gate insulation liner 161 is not formed on the bottom surface of the first insulation trench 160t. The first gate insulation filling film 162 may partially or entirely fill the first insulation trench 160t in which the first gate insulation liner 161 is formed.

In other embodiments, the first gate insulation filling film 162 may partially or entirely fill the first insulation trench 160t. The first gate insulation liner 161 is formed on the sidewall of the first gate insulation filling film 162. The first gate insulation liner 161 is not formed on at least a part of the bottom surface of the first gate insulation filling film 162.

In the semiconductor device according to some embodiments of the present inventive concept, the bottom surface of the first insulation trench 160t may be defined entirely by the field insulation film 105. The bottom surface 160bs of the first gate insulation support may be defined entirely by the field insulation film 105. Also, the first gate insulation liner 161 is not entirely formed on the bottom surface of the first gate insulation filling film 162. The bottom surface 160bs of the first gate insulation support may, in some embodiments, be covered entirely the first gate insulation filling film 162.

Figure 5:
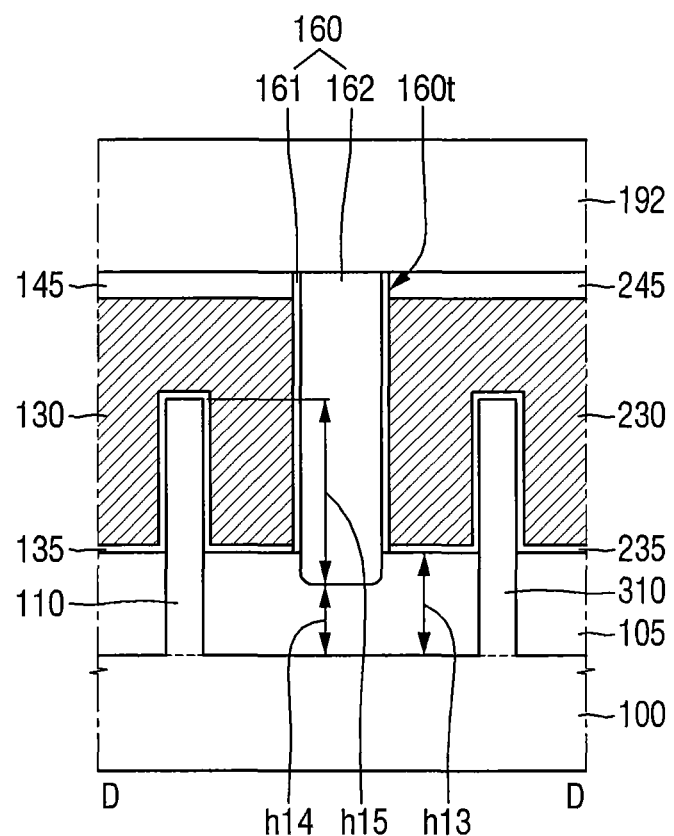

In FIG. 5, the first gate insulation film 135 and the second gate insulation film 235 do not extend along the sidewall of the first gate insulation support 160, respectively. The first gate electrode 130 and the second gate electrode 230 may be in contact with the first gate insulation support 160. The first gate insulation liner 161 includes a portion, which extends between the first gate insulation filling film 162 and the first capping pattern 145 and between the first gate insulation filling film 162 and the second capping pattern 245.

The upper surface 160us of the first gate insulation support may be placed on the same plane as the upper surface of the lower interlayer insulation film 191, and the upper surfaces of the first to sixth gate structures 120, 220, 320, 420, 520, and 620.

Figure 7:
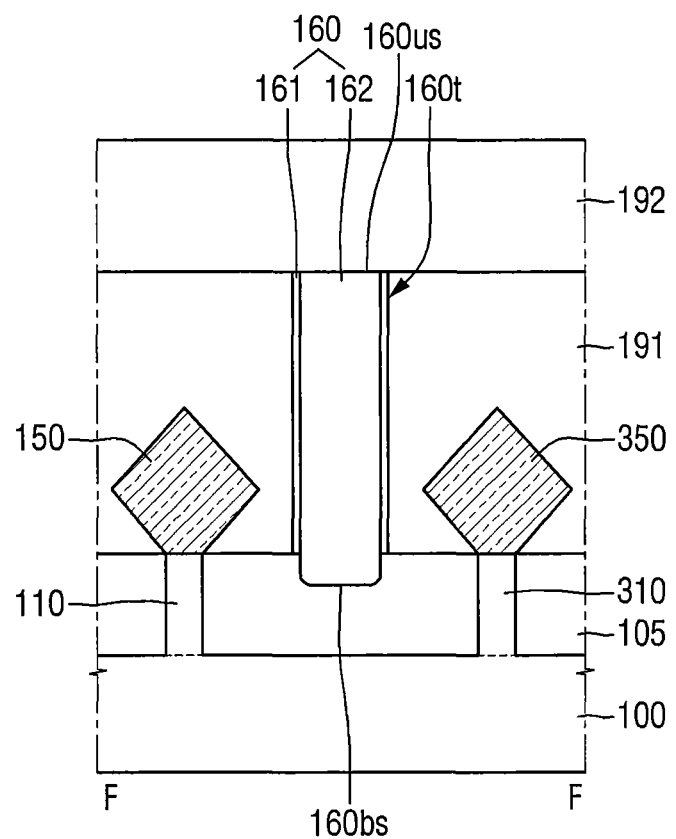

The first gate insulation support 160 may isolate the first and second gate structures 120 and 220 entirely in the first direction X. As a result, as illustrated in FIG. 7, the first gate insulation support 160 may be disposed between the first epitaxial pattern 150 on the first fin type pattern 110 and the third epitaxial pattern 350 on the third fin type pattern 310.

The first device isolation structure 180 may be disposed between the first fin type pattern 110 and the second fin type pattern 210. The first device isolation structure 180 may isolate the first fin type pattern 110 and the second fin type pattern 210 from each other. The first device isolation structure 180 may be disposed between the third gate structure 320 and the sixth gate structure 620. The first device isolation structure 180 may isolate the third gate structure 320 and the sixth gate structure 620 from each other.

The first device isolation structure 180 may be in contact with the third and sixth gate structures 320 and 620. The first device isolation structure 180 includes a first side 180a extending in the first direction X, and a second side 180b extending in the second direction Y. The third and sixth gate structures 320 and 620 may be in contact with the first side 180a of the first device isolation structure. The second side 180b of the first device isolation structure may face the short sides of the first and second fin type patterns 110 and 210.

The first device isolation structure 180 may be disposed in the isolating trench 180t included in the lower interlayer insulation film 191. The isolating trench 180t may be formed between the first epitaxial pattern 150 and the second epitaxial pattern 250, and between the third gate structure 320 and the sixth gate structure 620. The sidewalls of the isolating trench 180t between the first epitaxial pattern 150 and the second epitaxial pattern 250 may be defined by the dummy spacer 185, the first fin type pattern 110 and the second fin type pattern 210.

For example, the width between the sidewalls of the isolating trench 180t defined by the first fin type pattern 110 and the second fin type pattern 210 may be substantially constant in the thickness direction of the substrate 100. A part of the sidewalls of the isolating trench 180t between the third gate structure 320 and the sixth gate structure 620 may be defined by the field insulation film 105. A part of the isolating trench 180t is indented into the field insulation film 105.

The bottom surface of the isolating trench 180t may be defined by the field insulation film 105, the substrate 100, and the remaining fins RF. The remaining fin RF may be a part that remains after removal of the fin type pattern part in the etching stage of forming the isolating trench 180t. In other embodiments, there may be no remaining fin RF after etching is complete. A thickness h16 of the field insulation film 105 disposed between the first device isolation structure 180 and the substrate 100 is smaller than a thickness (h13 of FIG. 5) of the field insulation film 105 between the bottom surface of the third gate structure 320 and the substrate 100.

For example, the dummy spacer 185 may include the same material as the first gate spacer 140. Unlike the illustrated configuration, the dummy spacer 185 may not be disposed on a part of the sidewalls of the first device isolation structure 180. In FIG. 3, the height of the dummy spacer 185 is illustrated as being substantially identical to the height of the first gate spacer 140, but the height is not limited thereto in accordance with various embodiments of the inventive concept. The height of the dummy spacer 185 may be smaller than the height of the first gate spacer 140.

The first device isolation structure 180 may fill the isolating trench 180t. The first device isolation structure 180 may include a device isolation liner 181 and a device isolation filling film 182. The device isolation liner 181 extends along a part of the sidewalls of the isolating trench 180t. The device isolation liner 181 is not formed on the bottom surface of the isolating trench 180t. The device isolation filling film 182 may fill the isolating trench 180t in which the device isolation liner 181 is formed.

In other embodiments, the device isolation filling film 182 may partially or entirely fill the isolating trench 180t. The device isolation liner 181 is formed on the sidewalls of the device isolation filling film 182. The device isolation liner 181 is not formed on the bottom surface of the device isolation filling film 182.

Figure 6:
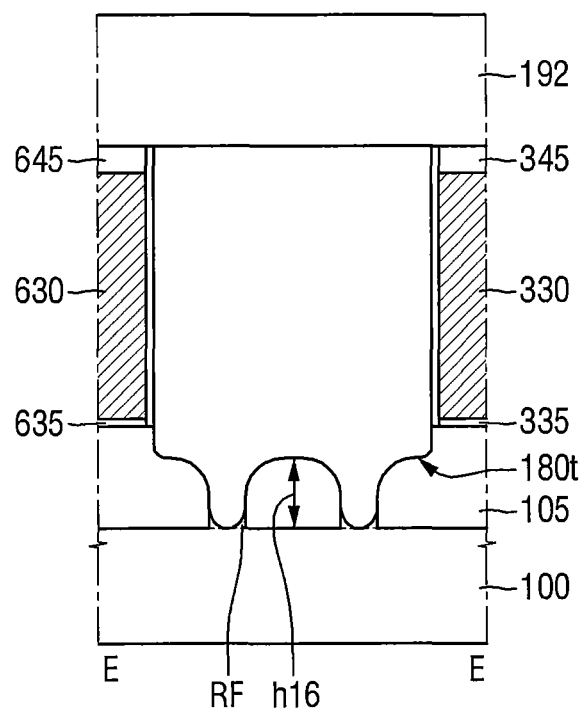

In FIG. 6, each of the third gate insulation film 335 and the sixth gate insulation film 635 does not extend along the sidewalls of the first device isolation structure 180. The third gate electrode 330 and the sixth gate electrode 630 may be in contact with the first device isolation structure 180. The device isolation liner 181 includes a portion, which extends between the first device isolation filling film 182 and the third capping pattern 345 and between the device isolation filling film 182 and the sixth capping pattern 645.

The first gate insulation support 160 and the first device isolation structure 180 are formed at the same manufacturing process stage. Therefore, a stacked structure of the first gate insulation support 160 may be the same as a stacked structure of the first device isolation structure 180.

For example, the first gate insulation support 160 may include the first gate insulation liner 161 and the first gate insulation filling film 162, and the first element isolating structure 180 may include the device isolation liner 181 and the device isolation filling film 182. The first gate insulation liner 161 may correspond to the device isolation liner 181, and the first gate insulation filling film 162 may correspond to the device isolation filling film 182. The first gate insulation liner 161 may include the same material as the device isolation liner 181.

The first gate insulation liner 161 and the device isolation liner 181 may include, for example, one or more of silicon nitride, silicon oxide, silicon carbide, silicon carbonitride, silicon oxycarbide, silicon oxynitride, silicone oxycarbonitride, and aluminum oxide.

The first gate insulation filling film 162 may include the same material as the device isolation filling film 182. The first gate insulation filling film 162 and the device isolation filling film 182 may include, for example, one or more of silicon nitride, silicon oxide, silicon carbide, silicon carbonitride, silicon oxycarbide, silicon oxynitride and silicon oxycarbonitride.

In the semiconductor device according to some embodiments of the present inventive concept, the depth h12 from the upper surface of the first fin type pattern 110 to the bottom surface of the first device isolation structure 180 may be substantially the same as the height h11 of the first fin type pattern 110.

Because a part of the first insulation trench 160*t* is indented into the field insulation film 105, the height h13 from the substrate 100 to the bottom surface of the second gate structure 220 is greater than the height h14 from the substrate 100 to the bottom surface of the first gate insulation support 160.

Further, a depth h15 from the upper surface of the first fin type pattern 110 to the bottom surface of the first gate insulation support 160 is smaller than the height h11 of the first fin type pattern 110. Therefore, the depth h12 from the upper surface of the first fin type pattern 110 to the bottom surface of the first device isolation structure 180 is greater than the depth h15 from the upper surface of the first fin type pattern 110 to the bottom surface of the first gate insulation support 160.

In FIG. 1, the first device isolation structure 180 is illustrated to isolate the two pairs of first and second fin type patterns 210, but embodiments of the present inventive concept are not limited thereto. Although the first gate insulation support 160 is illustrated to isolate the two gate structures, embodiments of the present inventive concept are not limited thereto.

Although the figures illustrate that there is no fin type pattern, which is not isolated by the first device isolation structure 180 between the first gate insulation support 160 and the first fin type pattern 110, this is only for convenience of explanation and embodiments of the inventive concept are not limited thereto.

Although the figures illustrate that there is no gate structure to be cut by the first gate insulation support 160 between the second gate structure 220 and the third gate structure 320, this is only for convenience and embodiments of the inventive concept are not limited thereto.

The upper interlayer insulation film 192 is formed on the lower interlayer insulation film 191, the first gate insulation support 160, the first device isolation structure 180, and the first to sixth gate structures 120, 220, 320, 420, 520, and 620. The lower interlayer insulation film 191 and the upper interlayer insulation film 192 may include, for example, but is not limited to, silicon oxide, silicon nitride, silicon oxynitride, FOX (Flowable Oxide), TOSZ (Tonen SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped Silicone Oxide), Xerogel, Aerogel, Amorphous, Fluorinated Carbon, OSG (Organo Silicate Glass), Parylene, BCB (bis-benzocyclobutenes), SiLK, polyimide, porous polymeric material or combinations thereof.

FIGS. 8-14 are cross-sectional views that illustrate a semiconductor device according to some embodiments of the present inventive concept. For convenience of explanation, differences from those embodiments described above with reference to FIGS. 1 to 7 will be primarily described.

Figure 8:
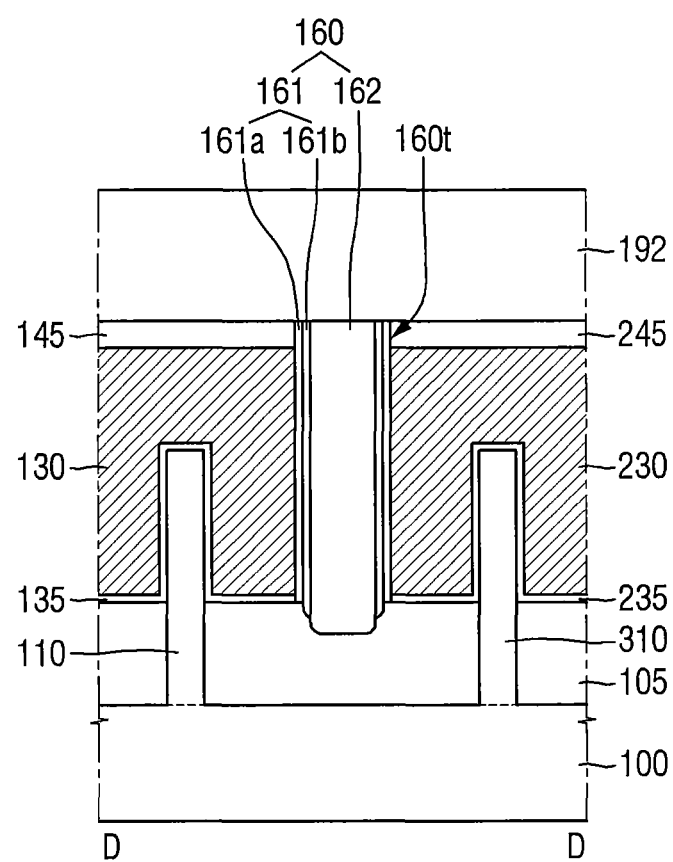
FIGS. 8-14 are cross-sectional views that illustrate a semiconductor device according to some embodiments of the present inventive concept.
Figure 9:
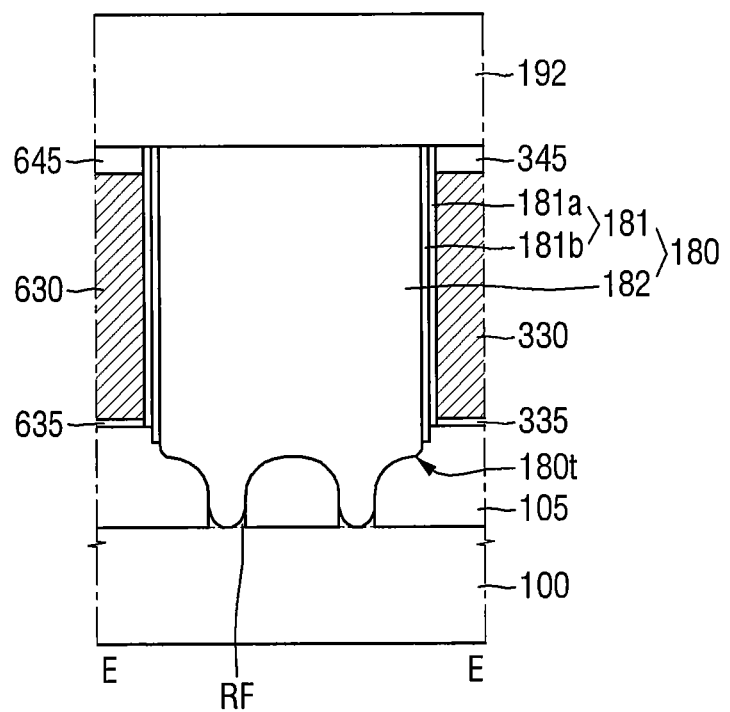

Referring to FIGS. 8 and 9, in a semiconductor device according to some embodiments of the present inventive concept, the first gate insulation liner 161 includes a lower insulation liner 161*a* and an upper insulation liner 161*b*, and the device isolation liner 181 includes a lower isolation liner 181*a* and an upper isolation liner 181*b*.

The upper insulation liner 161*b* is formed on the lower insulation liner 161*a*. The height of the upper insulation liner 161*b* is greater than that of the lower insulation liner 161*a*. A part of the upper insulation liner 161*b* does not extend along the lower insulation liner 161*a*.

The upper isolation liner 181*b* is formed on the lower isolation liner 181*a*. The height of the upper isolation liner 181*b* is greater than the height of the lower isolation liner 181*a*. A part of the upper isolation liner 181*b* does not extend along the lower isolation liner 181*a*.

The lower insulation liner 161*a* corresponds to the lower isolation liner 181*a*, and the upper isolation liner 181*b* may correspond to the upper insulation liner 161*b*. The lower insulation liner 161*a* may include the same material as the lower isolation liner 181*a*, and the upper isolation liner 181*b* may include the same material as the upper insulation liner 161*b*.

The first gate insulation support 160 includes a stacked structure of the lower insulation liner 161*a*, the upper insulation liner 161*b*, and the first gate insulation filling film 162. The first device isolation structure 180 includes a stacked structure of the lower isolation liner 181*a*, the upper isolation liner 181*b*, and the device isolation filling film 182.

That is, the stacked structure of the first gate insulation support 160 may, in some embodiments, be the same as the stacked structure of the first device isolation structure 180.

Figure 10:
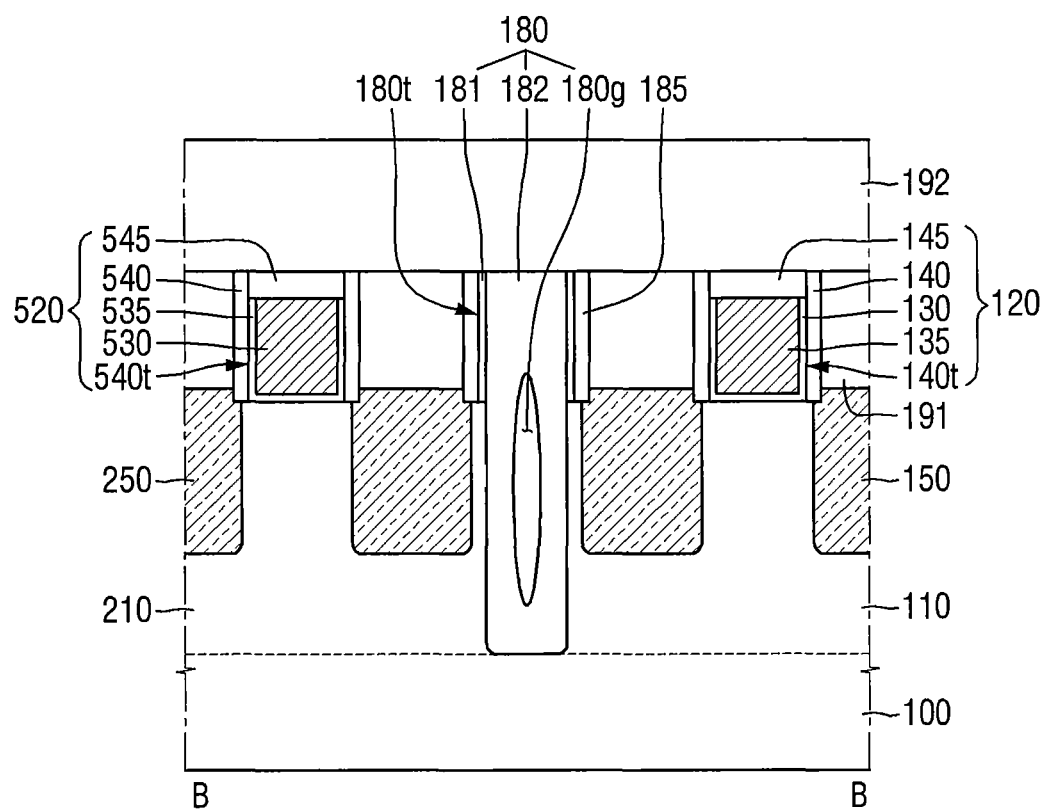

Referring to FIG. 10, in the semiconductor device according to some embodiments of the present inventive concept, the first device isolation structure 180 includes an isolating air gap 180g. The isolating air gap 180g may be at least partially surrounded by the device isolation filling film 182.

Figure 11:
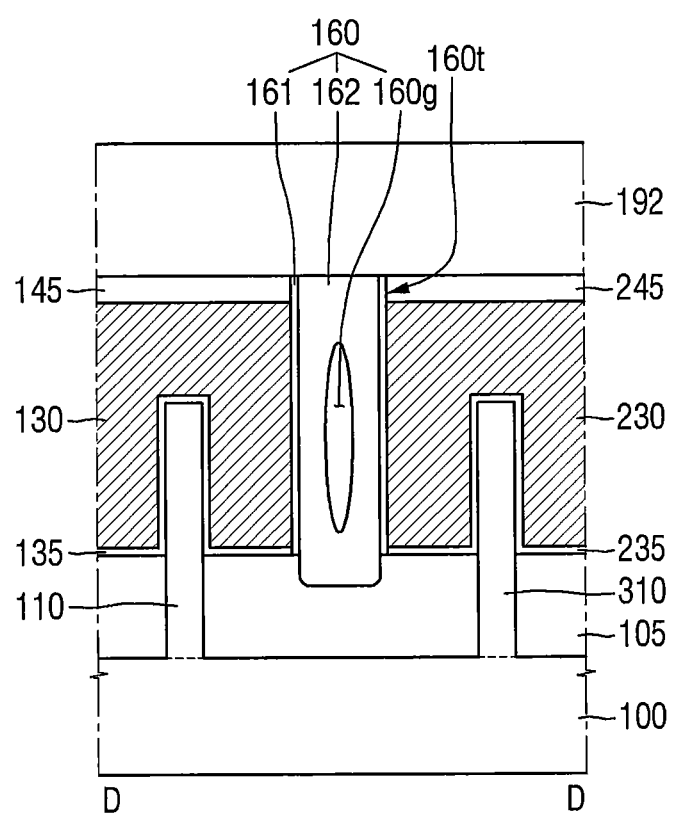

Referring to FIG. 11, in the semiconductor device according to some embodiments of the present inventive concept, the first gate insulation support 160 includes an insulating air gap 160g. The insulating air gap 160g may be wrapped by the first gate insulation filling film 162.

In FIGS. 10 and 11, the first gate insulation support 160 and the first device isolation structure 180 may simultaneously include an air gap, but embodiments of the inventive concept are not limited thereto. Depending on the width of the first gate insulation support 160 in the second direction Y and the width of the first device isolation structure 180 in the first direction X, only one of the insulating air gap 160g and the isolating air gap 180g may be formed in other embodiments of the inventive concept.

In the semiconductor device according to some embodiments of the present inventive concept, the presence or absence of an air gap is excluded in the stacked structure of the first gate insulation support 160 and the stacked structure of the first device isolation structure 180.

Figure 12:
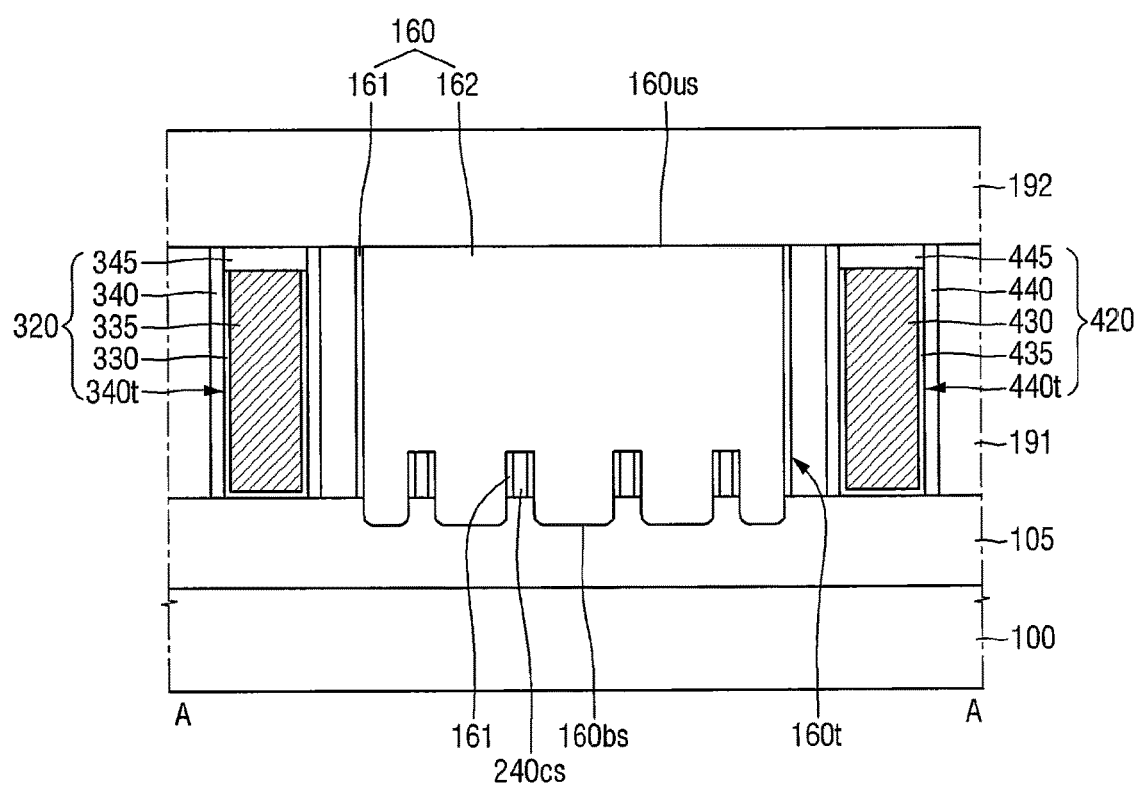

Referring to FIG. 12, the semiconductor device according to some embodiments of the present inventive concept may further include a connection spacer 240cs projecting from the upper surface of the field insulation film 105 between the first gate insulation support 160 and the field insulation film 105.

The connection spacer 240cs may be indented into the first gate insulation support 160. For example, the height of the connection spacer 240cs is smaller than the height of the third and fourth gate structures 320 and 440. Because the bottom surface of the connection spacer 340cs and the bottom surface of the third and fourth gate structures 320 and 420 may be in contact with the field insulation film 105, the upper surfaces of the third and fourth gate structures 320 and 420 are higher than the upper surface of the connection spacer 240cs.

Also, the connection spacer 240cs is directly connected to the first gate structure 120 and the second gate structure 220. The connection spacer 240cs may be contact with the first gate structure 120 and the second gate structure 220. The connection spacer 240cs may include the same material as the first and second gate spacers 140 and 240.

The first gate insulation liner 161 is illustrated as being disposed on the sidewall of the connection spacer 240cs, but embodiments of the inventive concept are not limited thereto. The first gate insulation liner 161 on the sidewall of the connection spacer 240cs may be removed depending on the height of the connection spacer 240cs, during formation of the first insulation trench 160t.

The bottom surface 160bs of the first gate insulation support may be defined by the field insulation film 105, the first gate insulation liner 161 and the connection spacer 240cs. That is, the first gate insulation liner 161 is not formed on a part of the bottom surface of the first gate insulation filling film 162.

Figure 13:
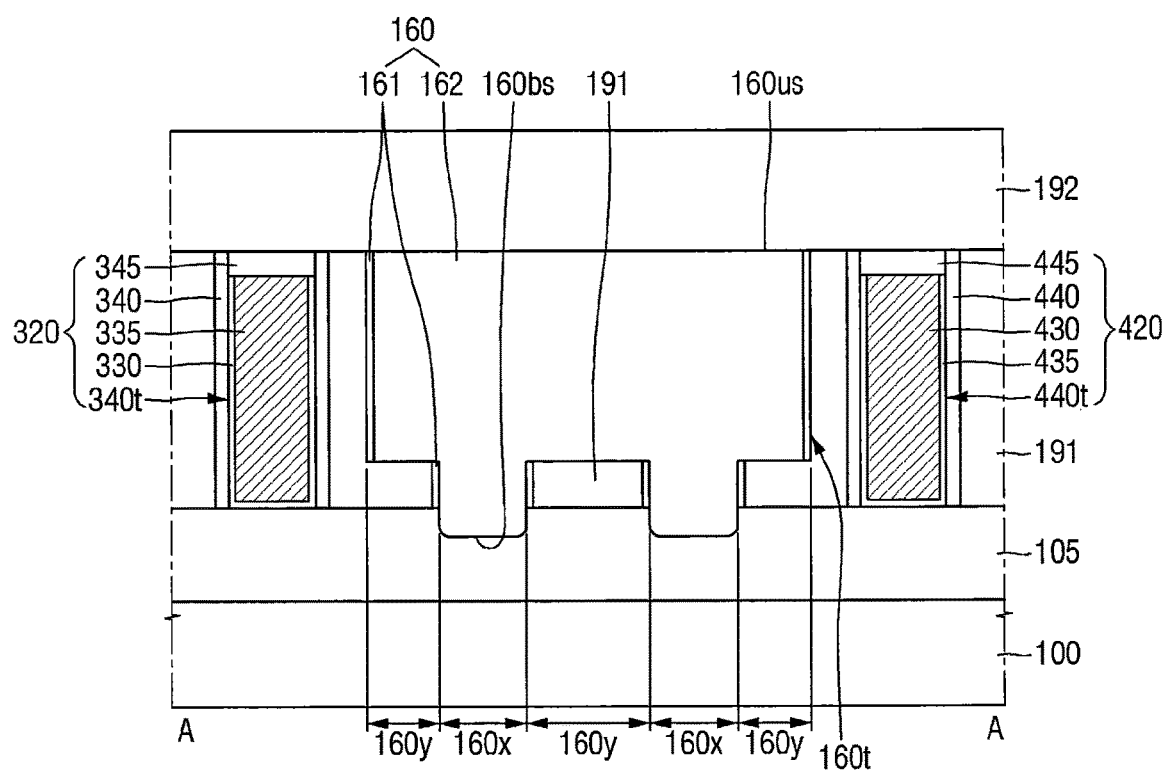
Figure 14:
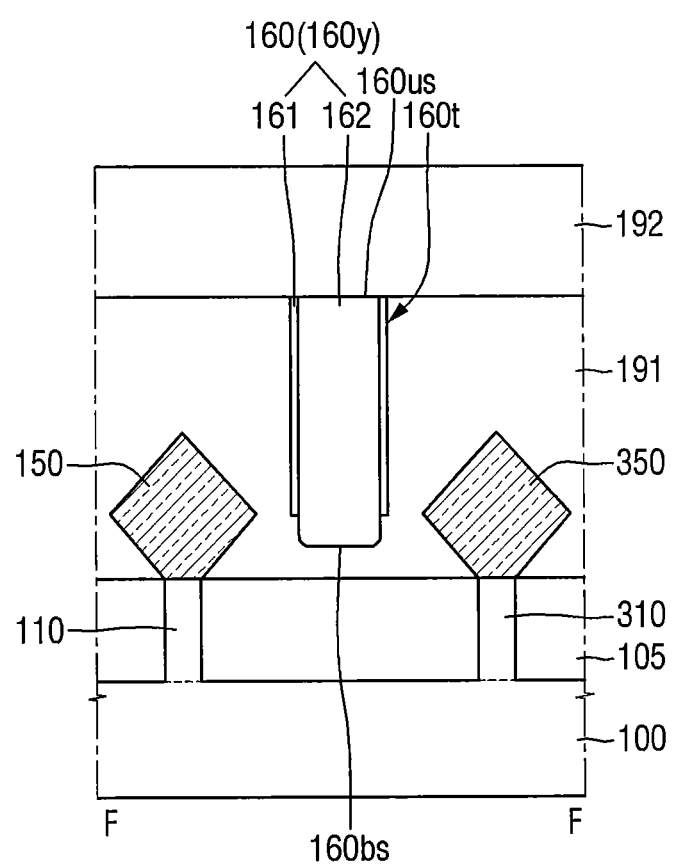

Referring to FIGS. 13 and 14, in the semiconductor device according to some embodiments of the present inventive concept, a part of the lower interlayer insulation film 191 may be interposed between the first gate insulation support 160 and the field insulation film 105.

For example, the first gate insulation support 160 includes a first portion 160x that abuts the first and second gate structures 120 and 220, and a second portion 160y that does not abut the first and second gate structures 120 and 220.

The first portion 160x of the first gate insulation support is located between the first gate structure 120 and the second gate structure 220. The second portion 160y of the first gate insulation support may be located between the adjacent first and third gate structures 120 and 320, between the adjacent first gate structures 120, and between the adjacent first and fourth gate structures 120 and 420.

A lower interlayer insulation film 191 may be interposed between the bottom surface of the second portion 160y of the first gate insulation support and the upper surface of the field insulation film 105.

The first gate insulation liner 161 is illustrated as being formed in the portion of the lower interlayer insulation film 191 interposed between the first gate insulation support 160 and the field insulation film 105, but embodiments of the inventive concept are not limited thereto.

FIGS. 15-26 are cross-sectional view diagrams that illustrate a semiconductor device according to some embodiments of the present inventive concept. FIG. 27 is a plan view diagram that illustrates a semiconductor device according to some embodiments of the present inventive concept. For convenience of explanation, differences from those embodiments described with reference to FIGS. 1 to 7 will be primarily described.

Referring to FIGS. 15 to 18, in a semiconductor device according to some embodiments of the present inventive concept, the first gate insulation filling film 162 includes a lower insulation filling film 162a and an upper insulation filling film 162b, and the device isolation filling film 182 includes a lower isolation filling film 182a and an upper isolation filling film 182b.

Figure 15:
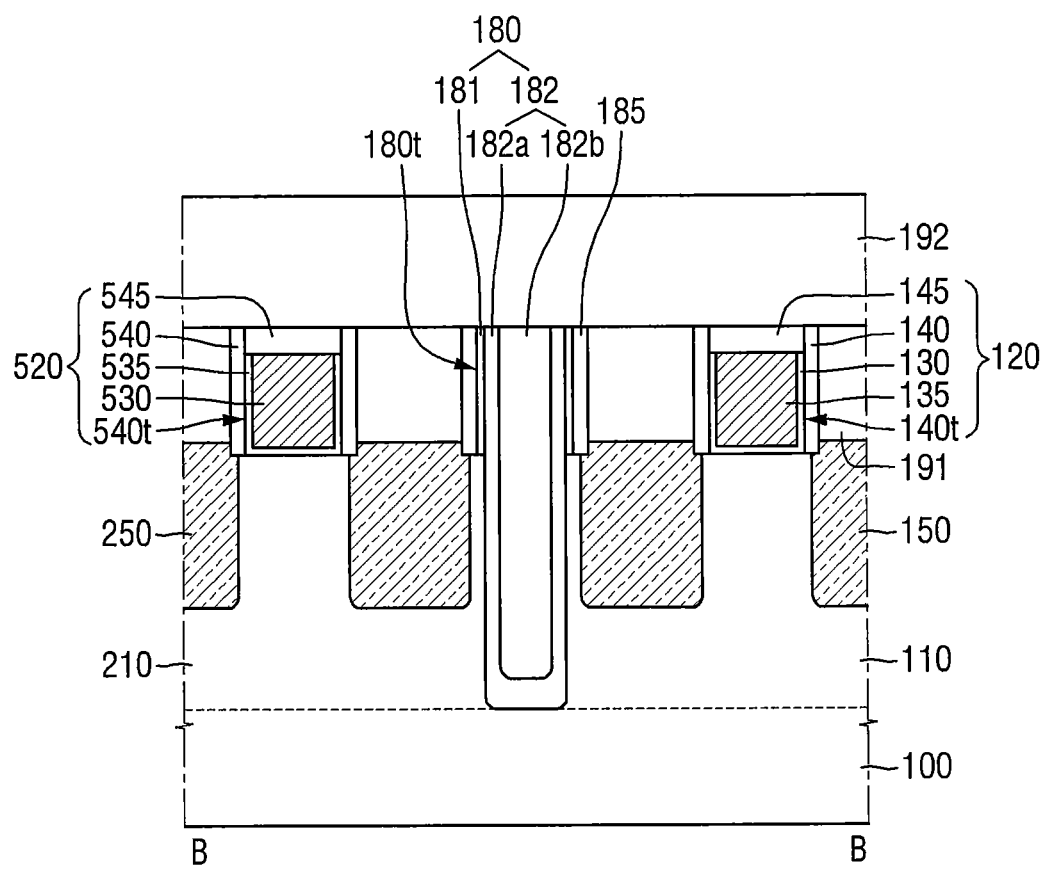
FIGS. 15-26 are cross-sectional view diagrams that illustrate a semiconductor device according to some embodiments of the present inventive concept.
Figure 16:
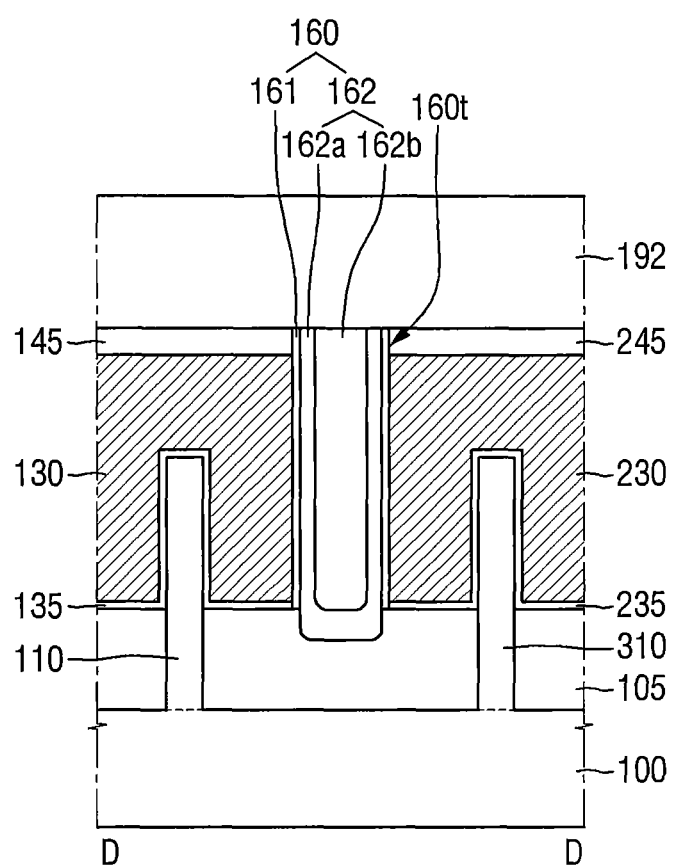

In FIGS. 15 and 16, the lower insulation filling film 162a may extend along the sidewalls and the bottom surface of the first insulation trench 160t. The upper insulation filling film 162b is formed on the lower insulation filling film 162a and may partially or entirely fill the first insulation trench 160t.

The lower isolation filling membrane 182a may extend along the sidewalls and the bottom surface of the isolating trench 180t. The upper isolation filling film 182b is formed on the lower isolation filling film 182a and may partially or entirely fill the isolating trench 180t.

Figure 17:
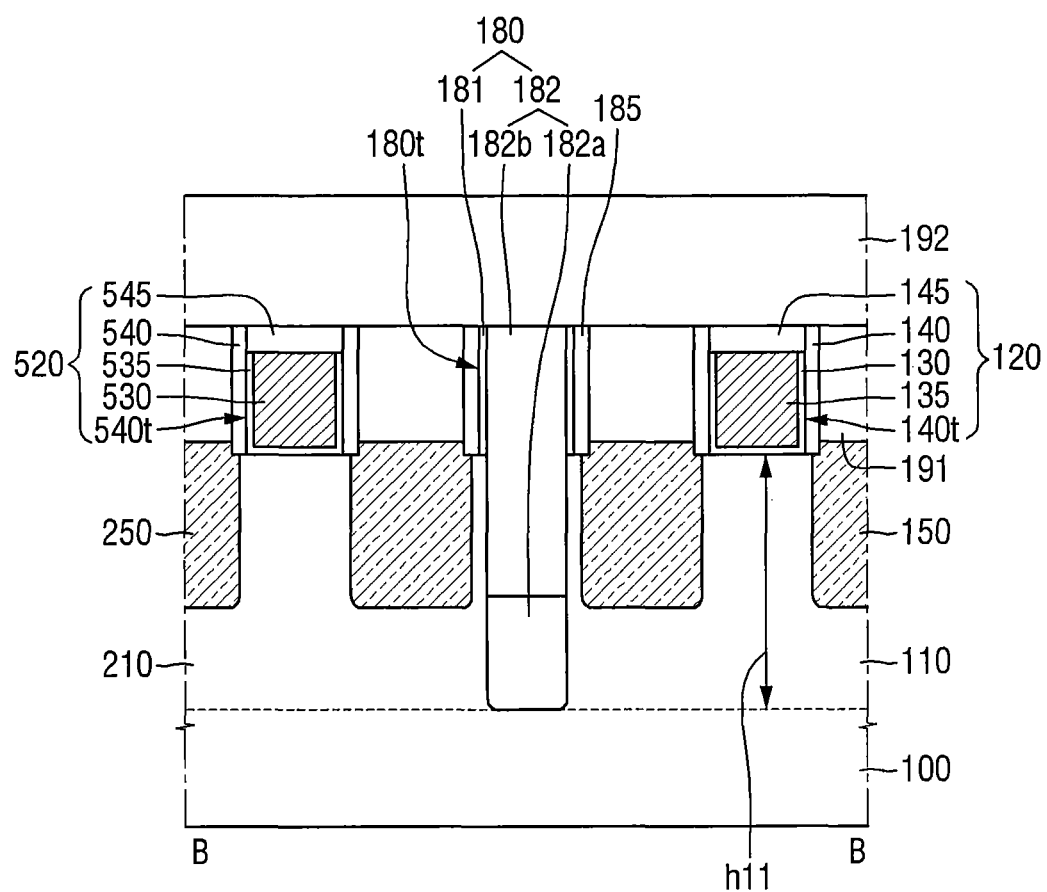
Figure 18:
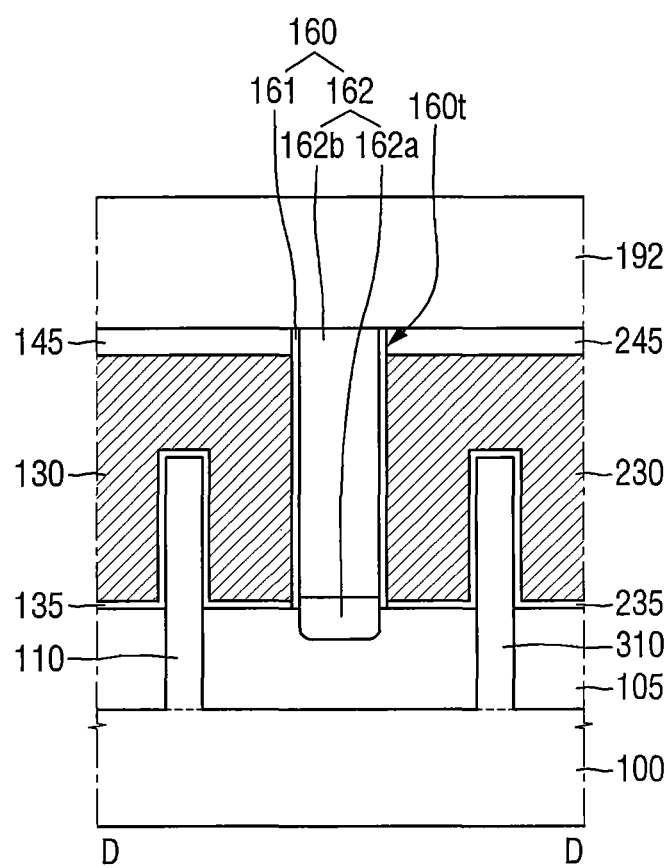

In FIGS. 17 and 18, the lower insulation filling film 162a may partially or entirely fill a part of the first insulation trench 160t. The upper insulation filling film 162b is formed on the lower insulation filling film 162a and may partially or entirely fill the remaining parts of the first insulation trench 160t. The lower insulation filling film 162a does not extend to the upper interlayer insulation film 192.

The lower isolation filling film 182a may partially or entirely fill a part of the isolating trench 180t. The upper isolation filling film 182b is formed on the lower isolation filling film 182a and may partially or entirely fill the remaining parts of the isolating trench 180t. The lower isolation filling film 182a does not extend to the upper interlayer insulation film 192.

In FIGS. 15 to 18, the lower insulation filling film 162a may correspond to the lower isolation filling film 182a, and the upper insulation filling film 162b may correspond to the upper isolation filling film 182b. The lower insulation filling film 162a may include the same material as the lower insulation filling film 182a, and the upper insulation filling film 162b may include the same material as the upper insulation filling film 182b.

The first gate insulation support 160 includes a stacked structure of the first gate insulation liner 161, the lower insulation filling film 162a, and the upper insulation filling film 162b. The first device isolation structure 180 includes a stacked structure of the device isolation liner 181, the lower isolation filling film 182a, and the upper isolation filling film

182*b*. That is, the stacked structure of the first gate insulation support 160 may, in some embodiments, be the same as the stacked structure of the first device isolation structure 180.

Figure 19:
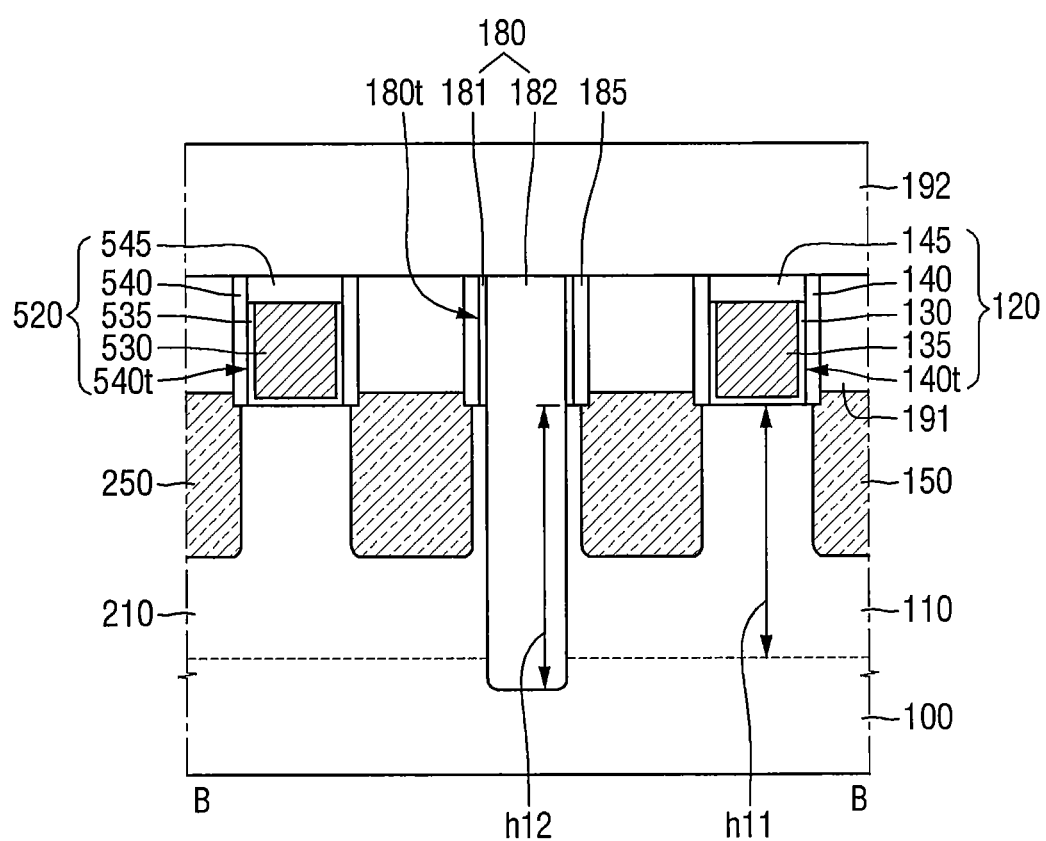

Referring to FIG. 19, in a semiconductor device according to some embodiments of the present inventive concept, a depth h12 from the upper surface of the first fin type pattern 110 to the bottom surface of the first device isolation structure 180 is larger than the height h11 of the first fin type pattern 110. A part of the isolating trench 180*t* extends to the inside of the substrate 100.

Figure 20:
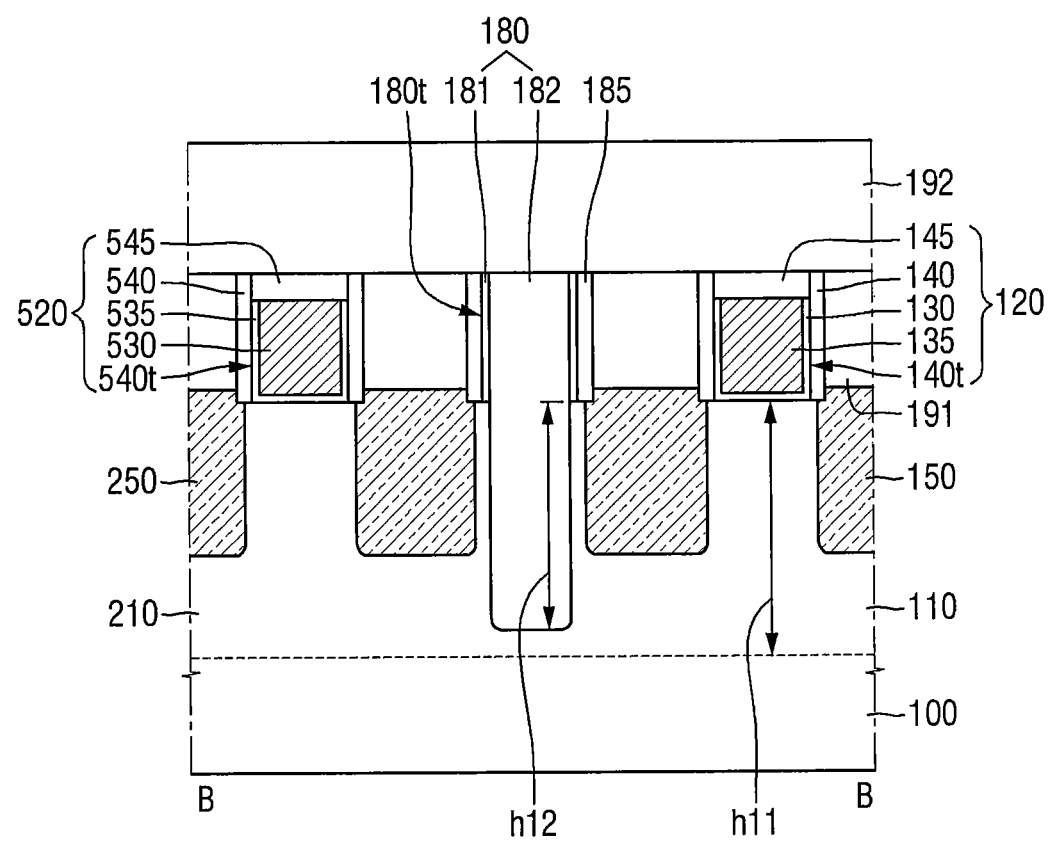

Referring to FIG. 20, in the semiconductor device according to some embodiments of the present inventive concept, the depth h12 from the upper surface of the first fin type pattern 110 to the bottom surface of the first device isolation structure 180 is smaller than the height h11 of the first fin type pattern 110.

The first fin type pattern 110 and the second fin type pattern 210 are connected by a semiconductor material on the substrate 100.

Figure 21:
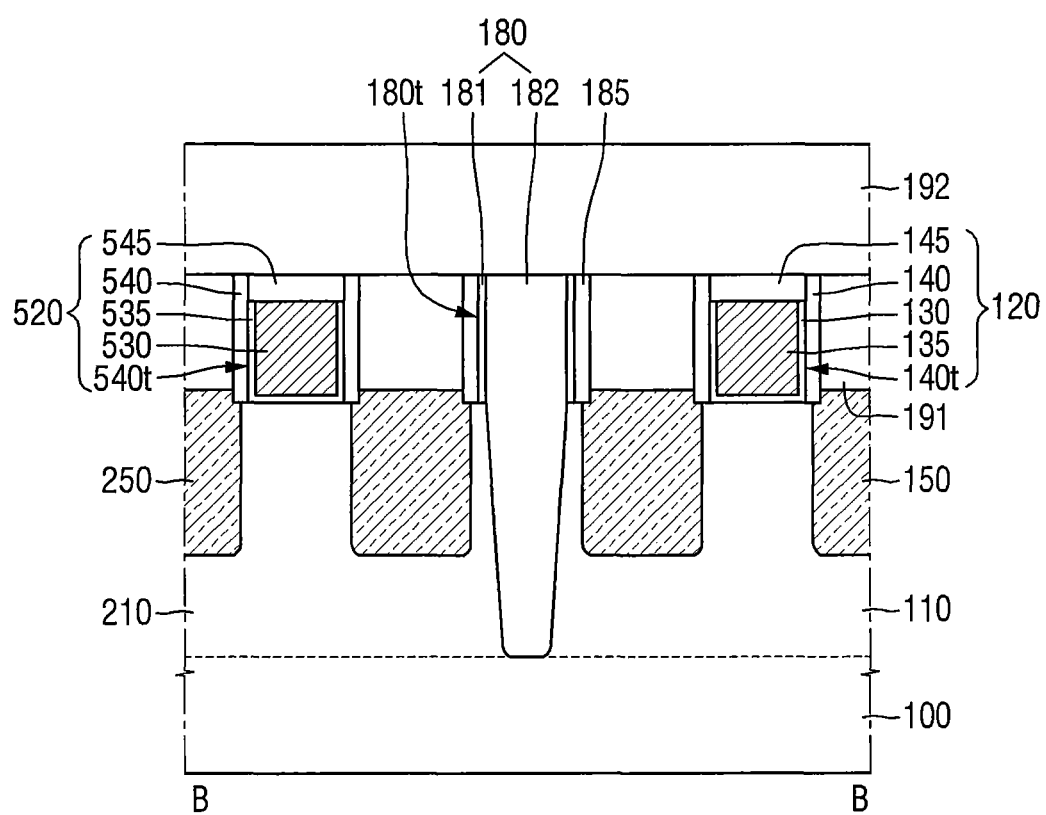

Referring to FIG. 21, in the semiconductor device according to some embodiments of the present inventive concept, the width between the sidewalls of the isolating trench 180*t* defined by the first fin type pattern 110 and the second fin type pattern 210 decreases as it approaches the substrate 100.

Figure 22:
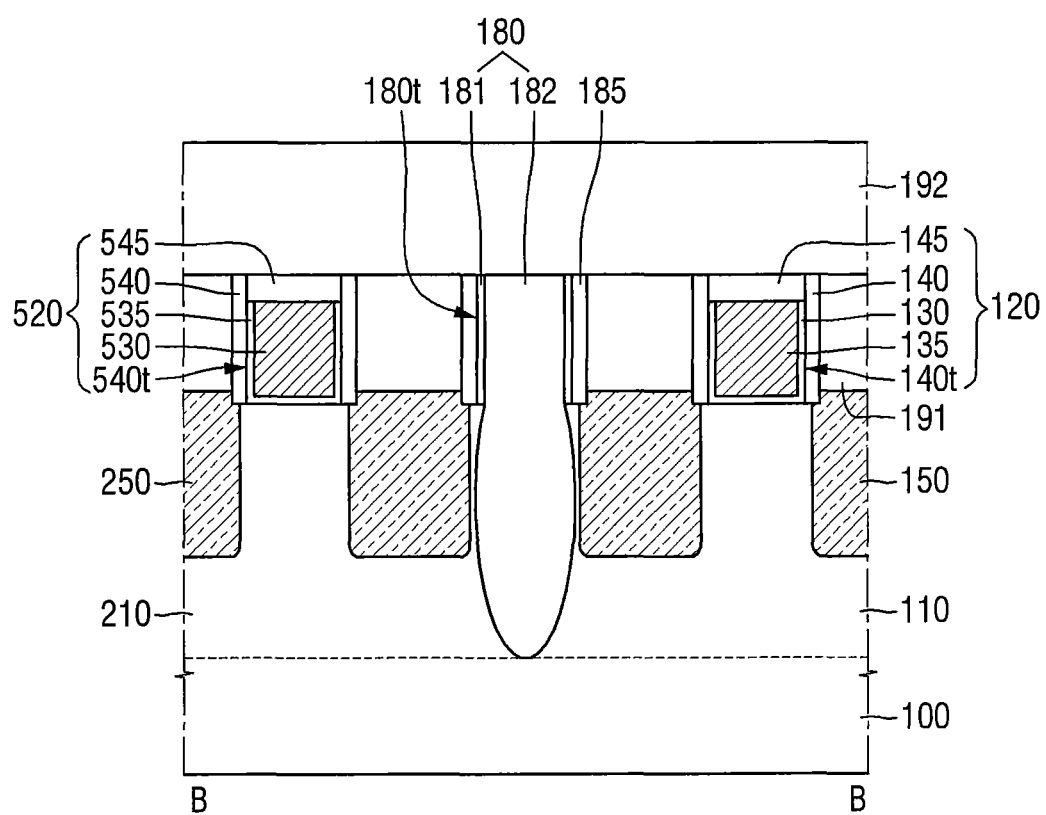

Referring to FIG. 22, in the semiconductor device according to some embodiments of the present inventive concept, the width between the sidewalls of the isolating trench 180*t* defined by the first fin type pattern 110 and the second fin type pattern 210 may increase and then decrease as the it approaches the substrate 100.

Figure 23:
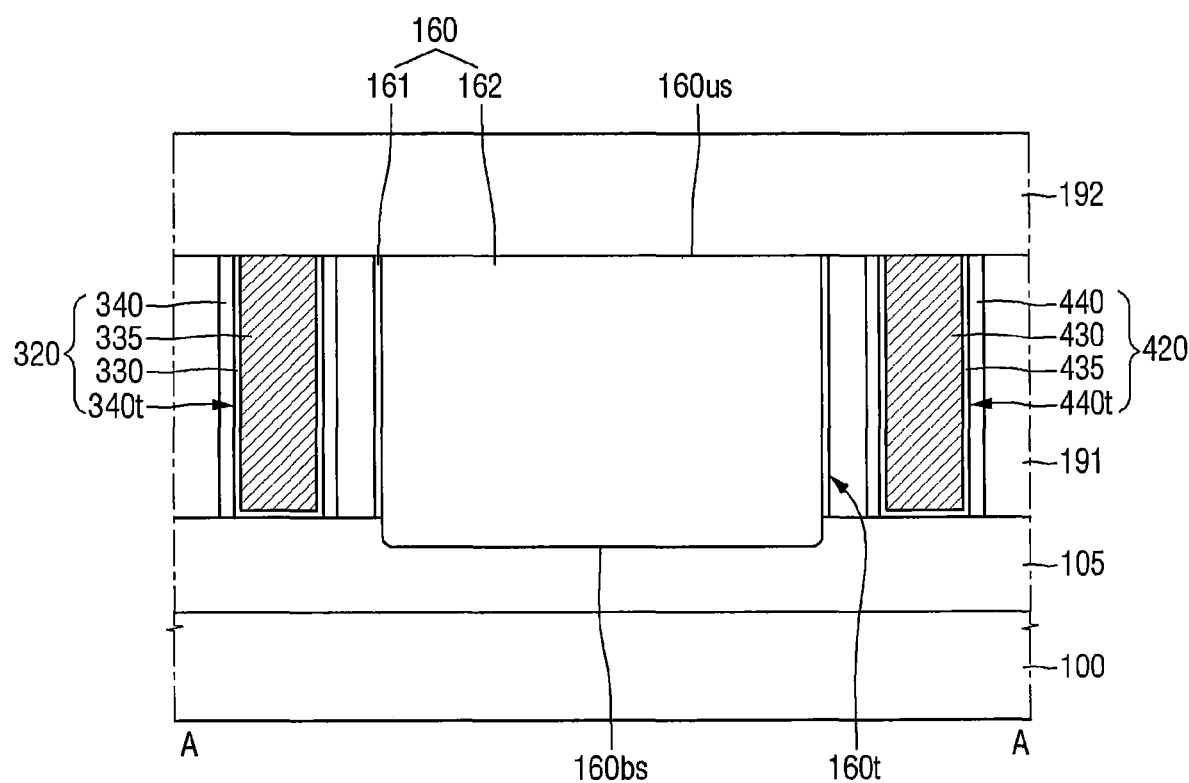

Referring to FIG. 23, in the semiconductor device according to some embodiments of the present inventive concept, the upper surfaces of the third and fourth gate electrodes 330 and 430 may be placed on the same plane as the upper surface of the lower interlayer insulation film 191. Likewise, the first, second, fifth and sixth gate electrodes (130, 230, 530, and 630 of FIGS. 3 to 6) may also be placed on the same plane as the upper surface of the lower interlayer insulation film 191.

Also, the upper surfaces of the first to sixth gate electrodes 130, 230, 330, 430, 530, and 630 may be placed on the same plane as the upper surface 160*u* of the first gate insulation support and the upper surface of the first device isolation structure 180. The first to sixth gate structures 120, 220, 320, 420, 520, and 620 may not include the capping patterns 145, 245, 345, and 445, respectively.

Figure 24:
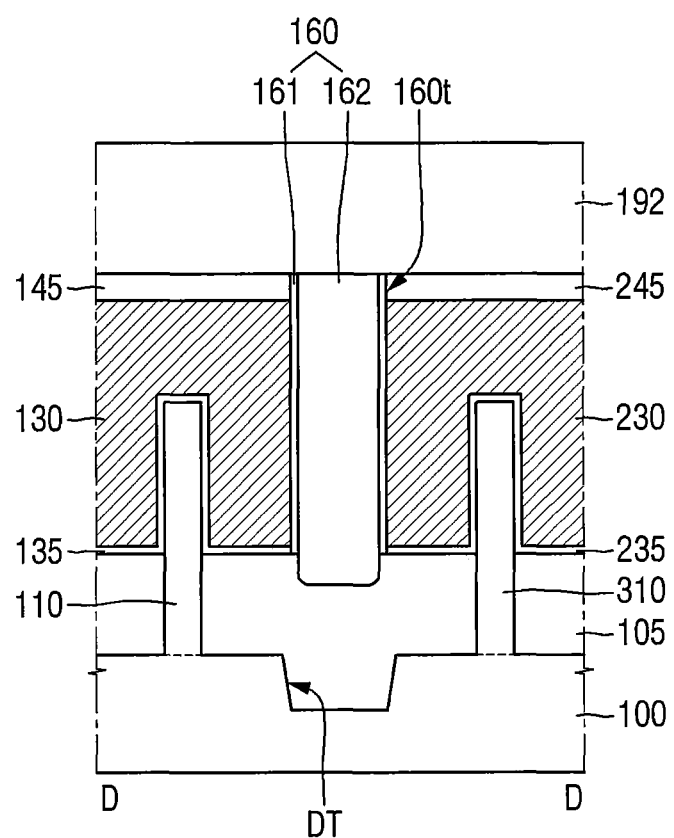

Referring to FIG. 24, in a semiconductor device according to some embodiments of the present inventive concept, a deep trench DT may be formed in the substrate 100 between the first fin type pattern 110 and the third fin type pattern 310. The deep trench DT may be deeper than the trench which defines the first fin type pattern 110 and the third fin type pattern 310. The field insulation film 105 partially or entirely fills the deep trench DT.

The first gate insulation support 160 may be formed on the field insulation film 105, which partially or entirely fills the deep trench DT.

Figure 25:
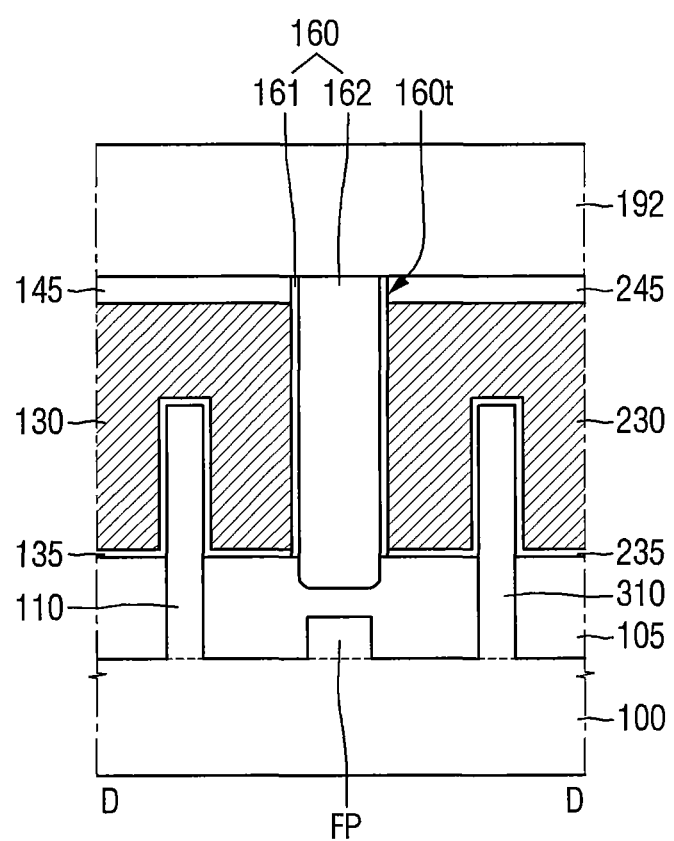

Referring to FIG. 25, a semiconductor device according to some embodiments of the present inventive concept may further include a protrusion pattern FP protruding from the substrate 100, between the first fin type pattern 110 and the third fin type pattern 310.

The height of the protrusion pattern FP is smaller than the height of the first fin type pattern 110 and the height of the third fin type pattern 310. The height of the protrusion pattern FP is smaller than the height of the field insulation film 105, which overlaps the first gate electrode 130. The protrusion pattern FP may extend, for example, in the first direction (X of FIG. 1), but embodiments of the inventive concept are not limited thereto.

Although the bottom surface of the first gate insulation support 160 is illustrated as being higher than the upper surface of the protrusion pattern FP, embodiments of the present inventive concept are not limited thereto. In some embodiments, the first gate insulation support 160 may be in contact with the protrusion pattern FP.

Figure 26:
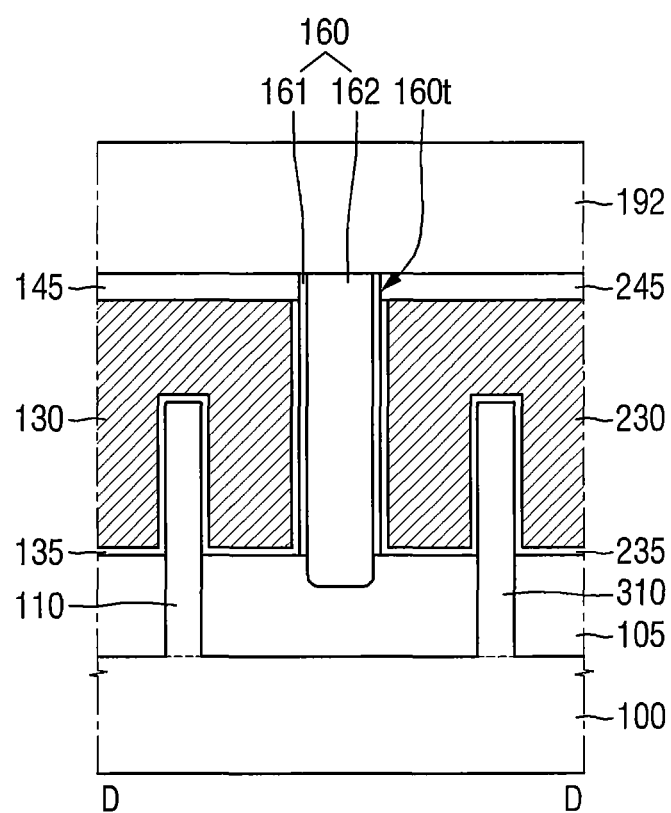
Figure 27:
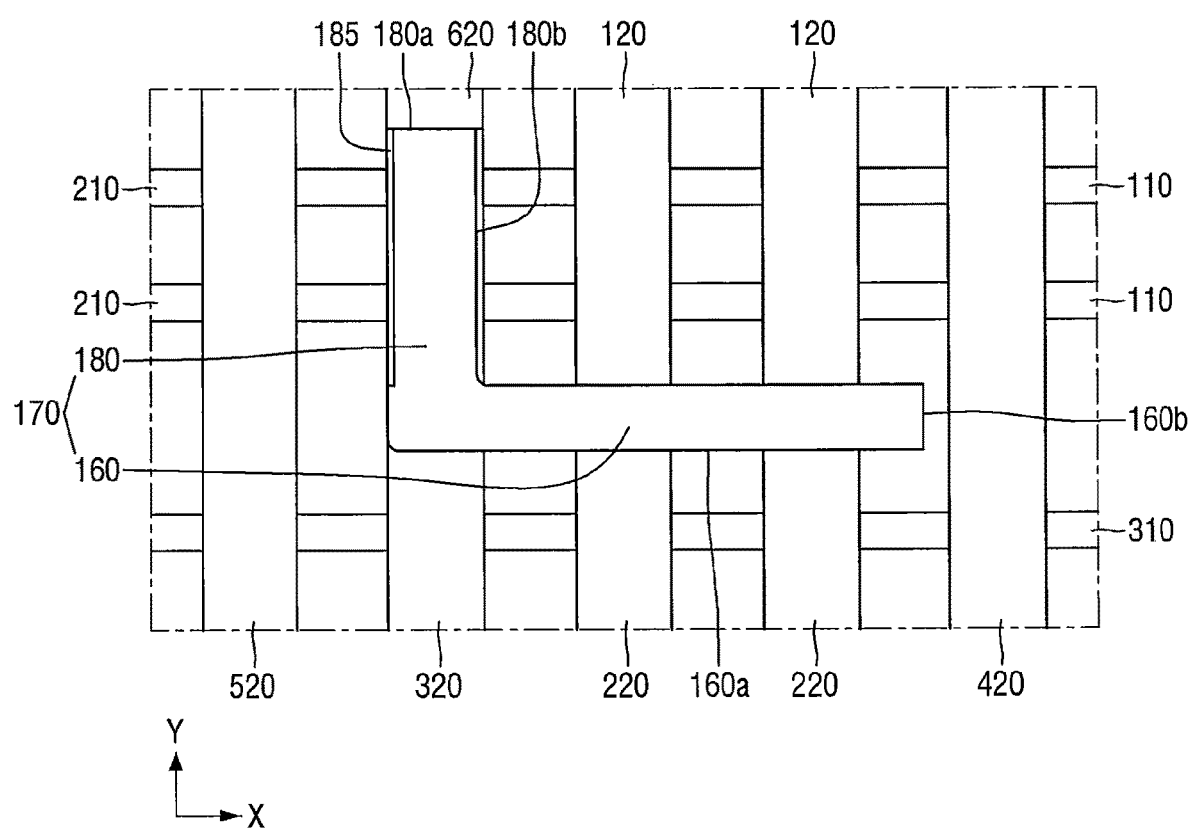
FIG. 27 is a plan view diagram that illustrates a semiconductor device according to some embodiments of the present inventive concept.

Referring to FIG. 26, in a semiconductor device according to some embodiments of the present inventive concept, the first and second gate insulation films 135 and 235 include the portions extending along the sidewalls of the first gate insulation support 160, respectively.

The first gate insulation film 135 may extend between the first gate electrode 130 and the first gate insulation support 160. The second gate insulation film 235 may extend between the second gate electrode 230 and the first gate insulation support 160.

Referring to FIG. 27, in a semiconductor device according to some embodiments of the present inventive concept, the first gate insulation support 160 and the first device isolation structure 180 may be in direct contact with each other. As used herein, when a first element is in direct contact with a second element this means that there are no intervening elements between the first and second elements. The isolating insulation pattern 170 including the first gate insulation support 160 and the first device isolation structure 180 may be an integral or monolithic structure.

For example, in some embodiments, the connection portion between the first gate insulation support 160 and the first device isolation structure 180 may be rounded.

The isolating insulation pattern 170 may include an isolation insulation filling film, and an isolating insulation liner extending along the sidewall of the isolation insulation filling film. The isolating insulation filling film may be in a form in which the first gate insulation filling film 162 and the device isolation filling film 182 are in direct contact with each other. The isolating insulation liner may be in a form in which the first gate insulation liner 161 and the device isolation liner 181 are in direct contact with each other. Therefore, the isolating insulation liner is not formed on at least a part of the bottom surface of isolating insulation filling film.

Figure 28:
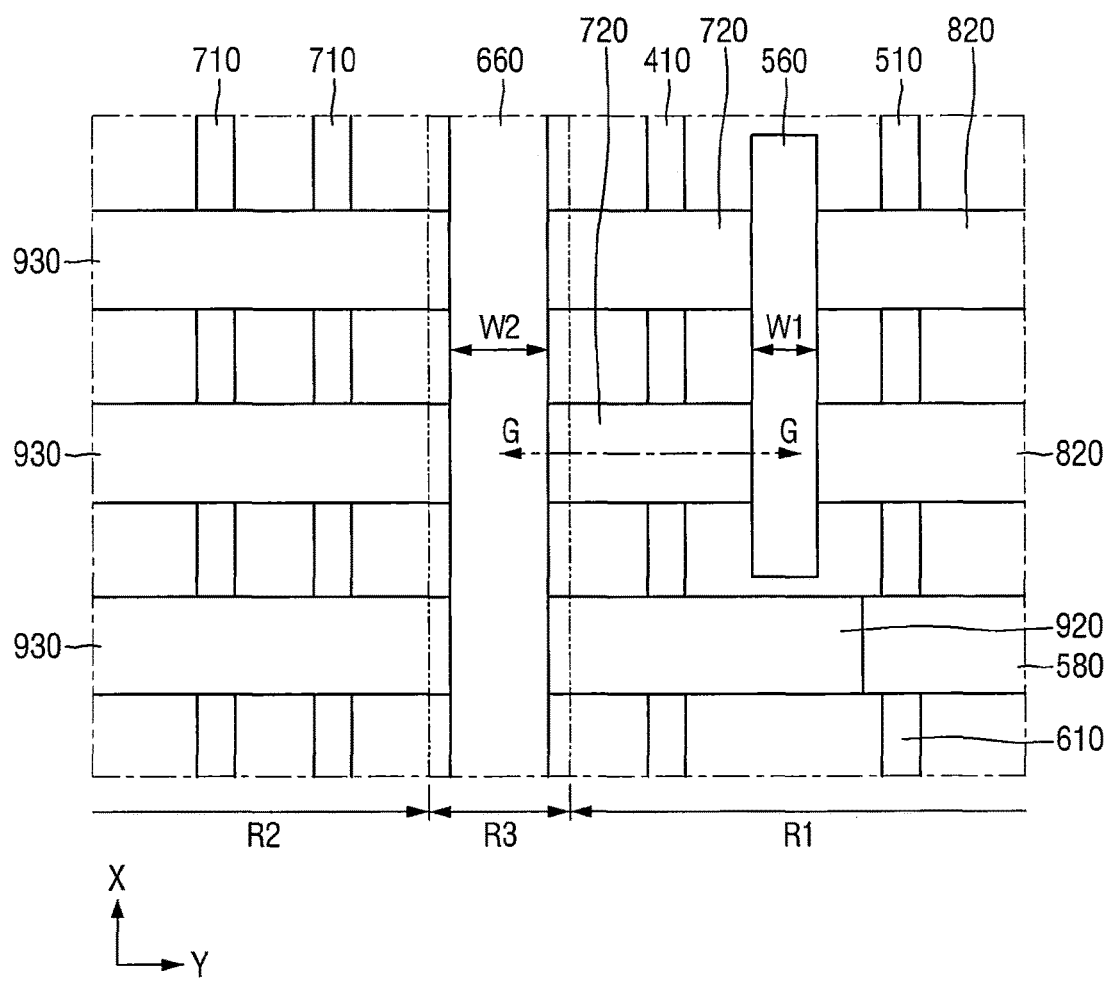
FIG. 28 is a schematic plan view illustrating a semiconductor device according to some embodiments of the present inventive concept.
Figure 29:
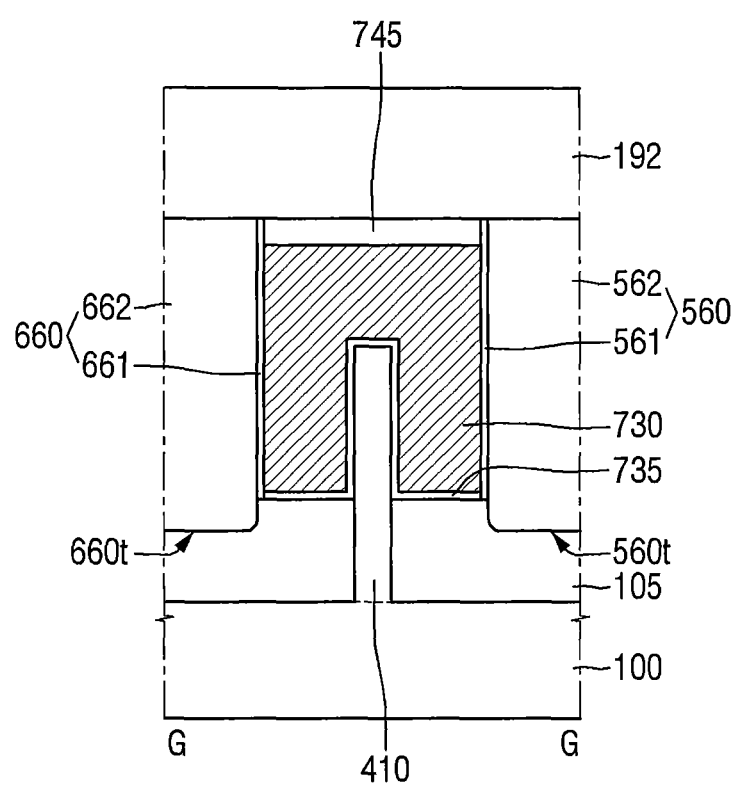
FIG. 29 is a cross-sectional view taken along the line G-G of FIG. 28.

FIG. 28 is a schematic plan view illustrating a semiconductor device according to some embodiments of the present inventive concept. FIG. 29 is a cross-sectional view taken along the line G-G of FIG. 28.

Referring to FIGS. 28 and 29, a semiconductor device according to some embodiments of the present inventive concept includes a fourth fin type pattern 410, a fifth fin type pattern 510, a sixth fin type pattern 610, a seventh fin type pattern 710, a seventh gate structure 710, an eighth gate structure 820, a ninth gate structure 920, a tenth gate structure 930, a second gate insulation support 560, a second device isolation structure 580, and a third gate insulation support 660.

The substrate 100 may include first to third regions R1, R2, and R3. The first region R1 and the second region R2 may be isolated from each other. The third region R3 may be interposed between the first region R1 and the second region R2. The first region R1 and the second region R2 may be spaced apart from each other in the second direction Y across the third region R3.

For example, the first region R1 may be a memory region, and the second region R2 may be a circuit region that provides control circuitry for the memory region. The third region R3 may correspond to a buffer region for ensuring that the transistors of the first region R1 and the second region R2 are sufficiently spaced apart to reduce the likelihood or prevent the transistors in the different regions from interfering with each other when the transistors of the first region R1 and the second region R2 are driven. However, the embodiments of the present inventive concept are not limited thereto.

The fourth to sixth fin type patterns 410, 510, and 610 may be disposed in the first region R1. The seventh fin type pattern 710 may be disposed in the second region R2. Each of the fourth to seventh fin type patterns 410, 510, 610, and 710 may extend on the substrate 100 along the first direction X.

The fifth and sixth fin type patterns 510 and 610 may be arranged in a row along the first direction X. The fifth fin type pattern 510 and the sixth fin type pattern 210 may be isolated by the second device isolation structure 580. Each of the fifth and sixth fin type patterns 510 and 610 may be spaced apart from the fourth fin type pattern 410 in the second direction Y.

Each of the seventh to tenth gate structures 720, 820, 920, and 930 may extend in the second direction Y on the field insulation film 105. The seventh gate structure 720 may be formed to intersect with the pattern 410 of the fourth fin type. The eighth gate structure 820 may be formed to intersect with the fifth fin type pattern 510. The seventh and eighth gate structures 720 and 820 may be disposed in a row along the second direction Y with the second gate insulation support 560 interposed therebetween. The seventh and eighth gate structures 720 and 820 may be isolated by the second gate insulation support 560 extending in the first direction X. The seventh and eighth gate structures 720 and 820 may be in contact with the second gate insulation support 560.

The ninth gate structure 920 may be formed to intersect with the fourth fin type pattern 410. The ninth gate structure 920 is not isolated by the second gate insulation support 560. The ninth gate structure 920 may be in contact with the second device isolation structure 580.

The tenth gate structure 930 may be formed to intersect with the seventh fin type pattern 710. The seventh and tenth gate structures 720 and 930 may be arranged in a row along the second direction Y with the third gate insulation support 660 interposed therebetween. The seventh and tenth gate structures 720 and 930 may be isolated by a third gate insulation support 660 extending in the first direction X. The ninth and tenth gate structures 920 and 930 may be arranged in a row along the second direction Y with the third gate insulation support 660 interposed therebetween. The ninth and tenth gate structures 920 and 930 may be isolated by the third gate insulation support 660 extending in the first direction X. The seventh, ninth and tenth gate structures 720, 920 and 930 may be in contact with the third gate insulation support 660.

Because the composition of the fourth to seventh fin type patterns 410, 510, 610, and 710 are similar to those of the first to third fin type patterns (110, 210, and 310 of FIG. 1), the description thereof will not be provided. Because the composition of the seventh to tenth gate structures 720, 820, 920 and 930 are similar to those of the first to fifth gate structures (120, 220, 320, 320, 420, 520, and 620 of FIG. 1), a description thereof will not be provided.

In a semiconductor device according to some embodiments of the present inventive concept, the width W1 of the second gate insulation support 560 in the second direction Y may be smaller than or equal to the width W2 of the third gate insulation support 660 in the second direction Y.

The seventh gate insulation film 735 may extend along the fourth fin type pattern 410 protruding upward from the upper surface of the field insulation film 105 and the upper surface of the field insulation film 105. The seventh gate electrode 730 may be formed on the seventh gate insulation film 735. The seventh capping pattern 745 may be formed on the seventh gate electrode 730.

The second gate insulation support 560 and the third gate insulation support 660 may be disposed with the seventh gate electrode 730 therebetween.

The second gate insulation support 560 may be disposed in the second insulating trench 560t. A part of the second insulating trench 560t is indented into the field insulation film 105. At least a part of the bottom surface of the second insulating trench 560t may be defined by the field insulation film 105.

The second gate insulation support 560 may fill the second insulating trench 560t. The second gate insulation support 560 may include a second gate insulation liner 561 and a second gate insulation filling film 562. The second gate insulation liner 561 extends along a part of the sidewall of the second insulating trench 560t. The second gate insulation liner 561 is not formed on the bottom surface of the second insulating trench 560t. The second gate insulation filling film 562 may partially or entirely fill the second insulating trench 560t in which the second gate insulation liner 561 is formed. For example, the second gate insulation support 560 may have substantially the same structure as the first gate insulation support (160 of FIG. 1).

The third gate insulation support 660 may be disposed in the third insulating trench 660t. A part of the third insulating trench 660t is indented into the field insulation film 105. At least a part of the bottom surface of the third insulating trench 660t may be defined by the field insulation film 105.

The third gate insulation support 660 may partially or completely fill the third insulating trench 660t. The third gate insulation support 660 may include a third gate insulation liner 661 and a third gate insulation filling film 662. The third gate insulation liner 661 extends along a part of the sidewall of the third insulating trench 660t. The third gate insulation liner 661 is not formed on the bottom surface of the third insulating trench 660t. The third gate insulation filling film 662 may partially or completely fill the third insulating trench 660t in which the third gate insulation liner 661 is formed.

The second gate insulation support 560 and the third gate insulation support 660 are formed in a same stage of the manufacturing process. Therefore, the stacked structure of the second gate insulation support 560 may be the same as the stacked structure of the third gate insulation support 660 in some embodiments of the inventive concept.

Figure 30:
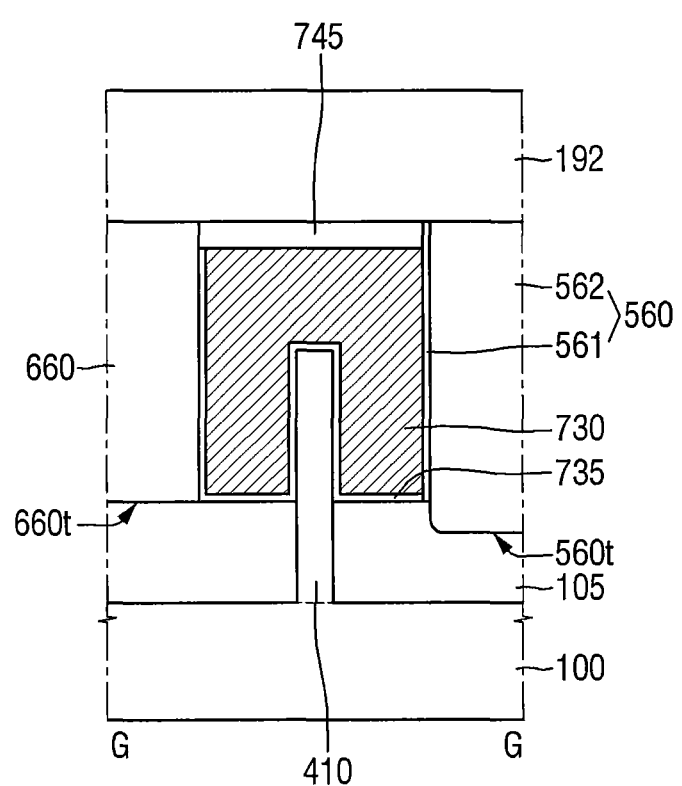
FIG. 30 is a cross-sectional view diagram that illustrates a semiconductor device according to some embodiments of the present inventive concept.

FIG. 30 is a cross-sectional view diagram that illustrates a semiconductor device according to some embodiments of the present inventive concept. For convenience of explanation, differences from those embodiments described with reference to FIG. 28 and FIG. 29 will be primarily described.

Referring to FIG. 30, in a semiconductor device according to some embodiments of the present inventive concept, the stacked structure of the second gate insulation support 560 may be different from the stacked structure of the third gate insulation support 660.

For example, the second gate insulation support 560 may be formed at a different manufacturing process stage from that of the third gate insulation support 660.

The seventh gate insulation film 735 may not extend along the sidewall of the second gate insulation support 560. The seventh gate insulation film 735 may extend along the sidewall of the third gate insulation support 660.

Also, the depth and/or shape of the bottom surface of the second insulating trench 560t may be different from the depth and shape of the bottom surface of the third insulating trench 660t.

FIGS. 31-45 are cross-sectional intermediate stage diagrams that illustrate methods of manufacturing a semiconductor device according to some embodiments of the present inventive concept. The operations illustrated with reference to FIGS. 31-45 may be used, for example, to manufacture the semiconductor device embodiments described with reference to FIGS. 8 and 9.

Figure 31:
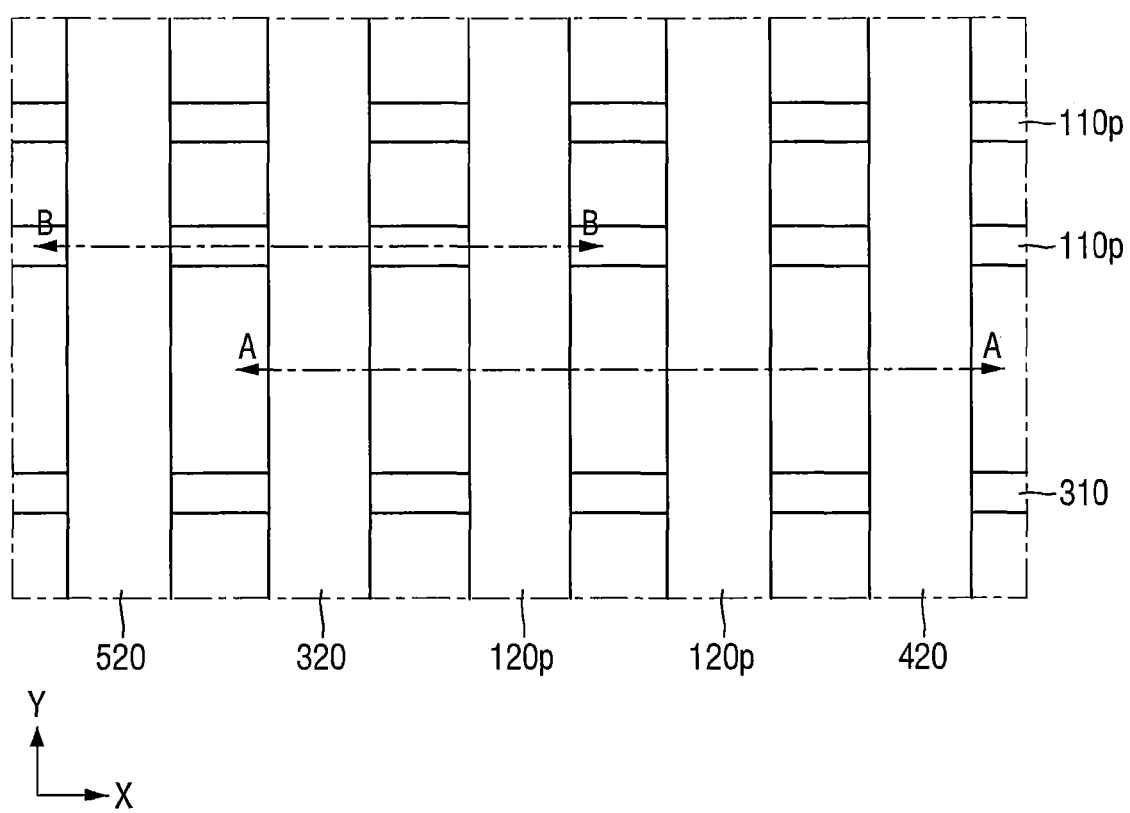
FIGS. 31-45 are cross-sectional intermediate stage diagrams that illustrate methods of manufacturing a semiconductor device according to some embodiments of the present inventive concept.

FIGS. 32, 34, 36, 38, 40, 42, and 44 are cross-sectional views taken along the line A-A of FIG. 31. FIGS. 33, 35, 37, 39, 41, 43, and 45 are cross-sectional views taken along the line B-B of FIG. 31.

In the following description of the manufacturing method, operations and structures described above with reference to FIGS. 1 to 30 will be briefly described or omitted.

Figure 32:
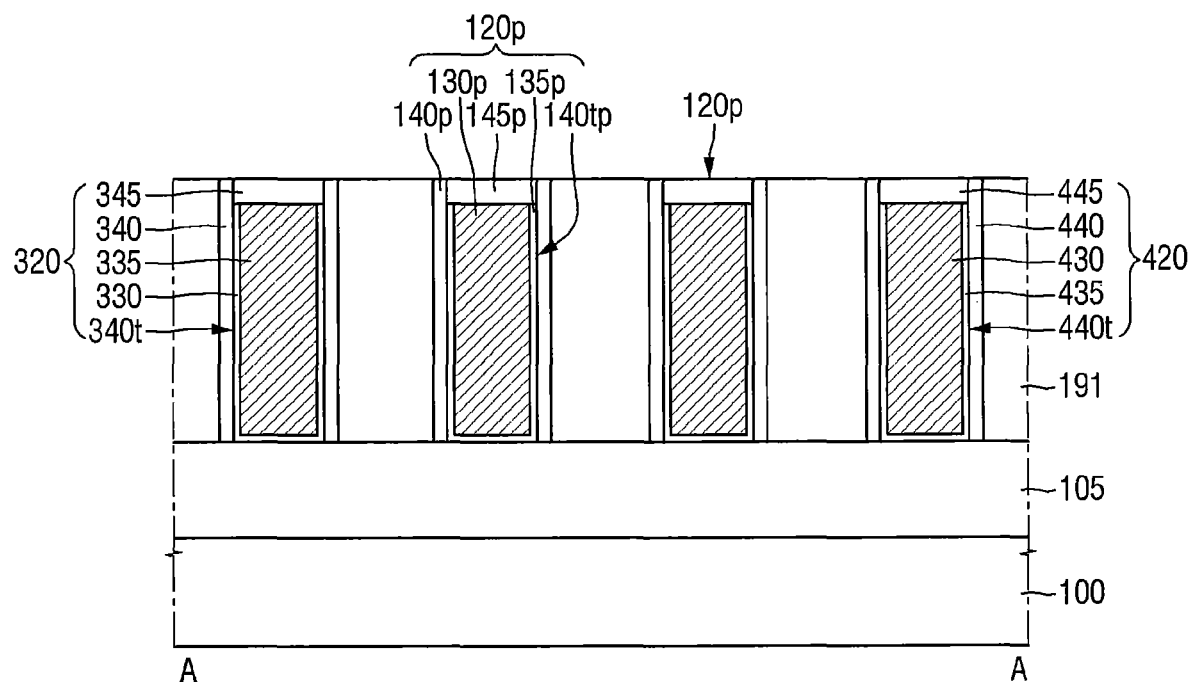
Figure 33:
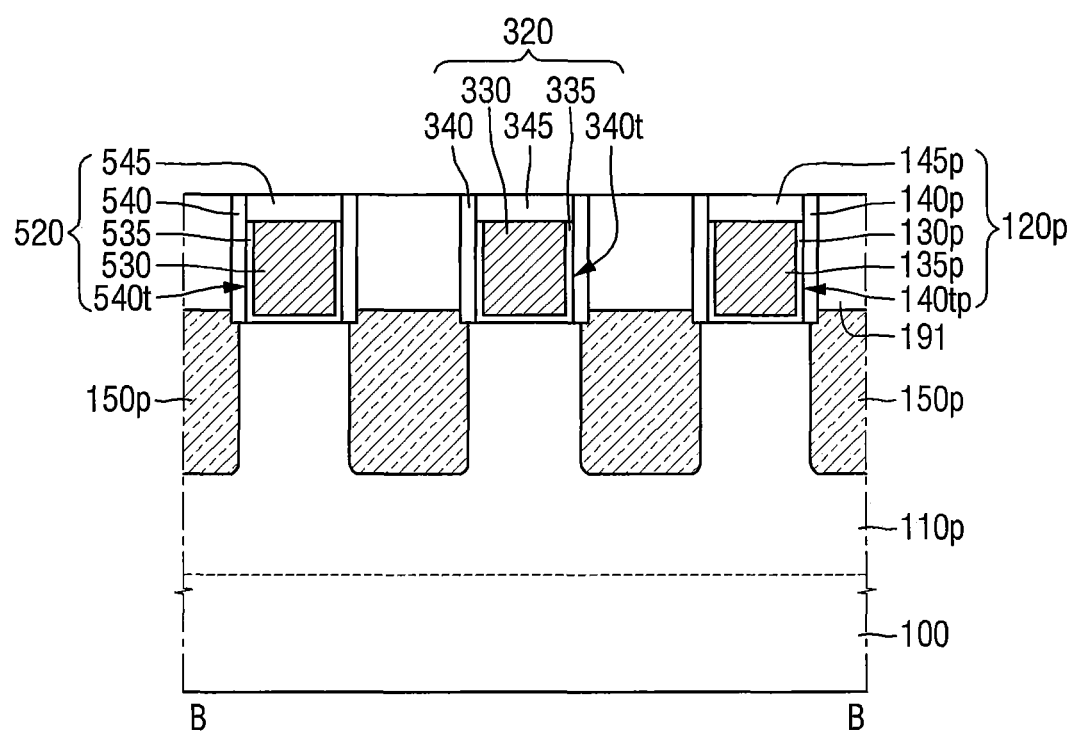

Referring to FIGS. 31-33, a pre-fin type pattern 110p extending in the first direction X and a third fin type pattern 310 are formed on the substrate 100. A pre-epitaxial pattern 150p may be formed on the pre-fin type pattern 110p.

A pre-gate structure 120p and third to fifth gate structures 320, 420, and 520 extending in the second direction Y are formed on the pre-fin type pattern 110p and the third fin type pattern 310.

The pre-fin type pattern 110p includes a pre-gate electrode 130p, a pre-gate insulation film 135p, a pre-gate spacer 140p, a pre-gate trench 140tp, and a pre-capping pattern 145p.

Figure 34:
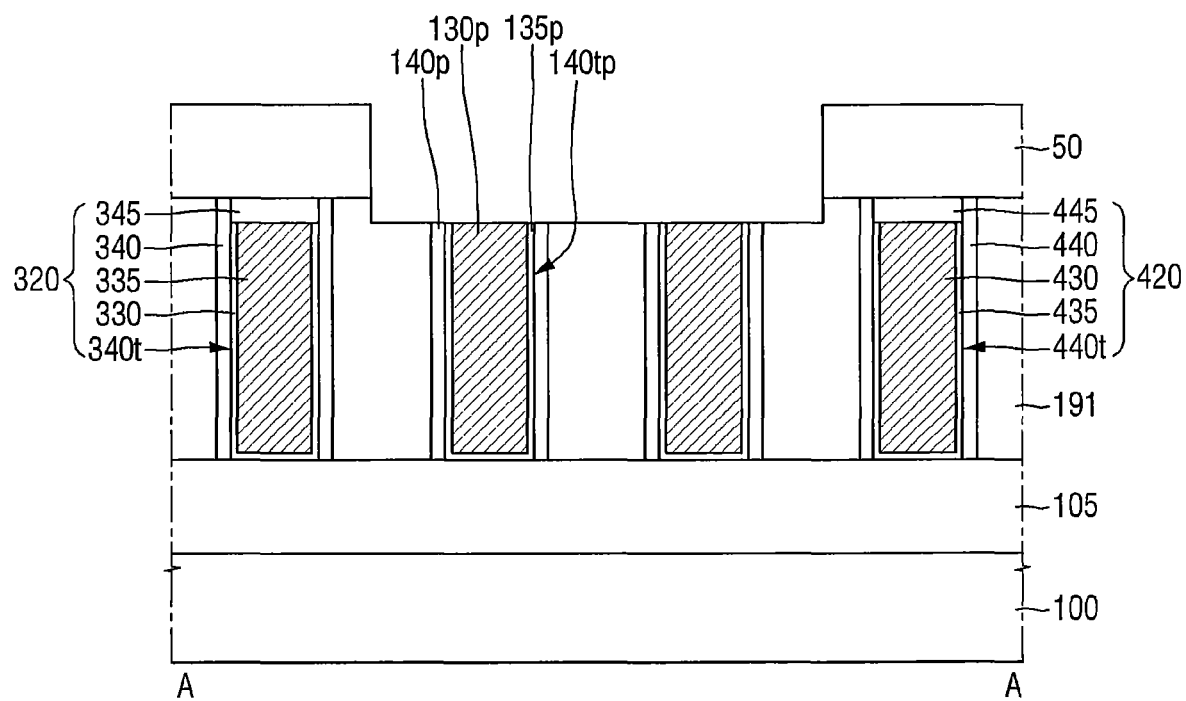
Figure 35:
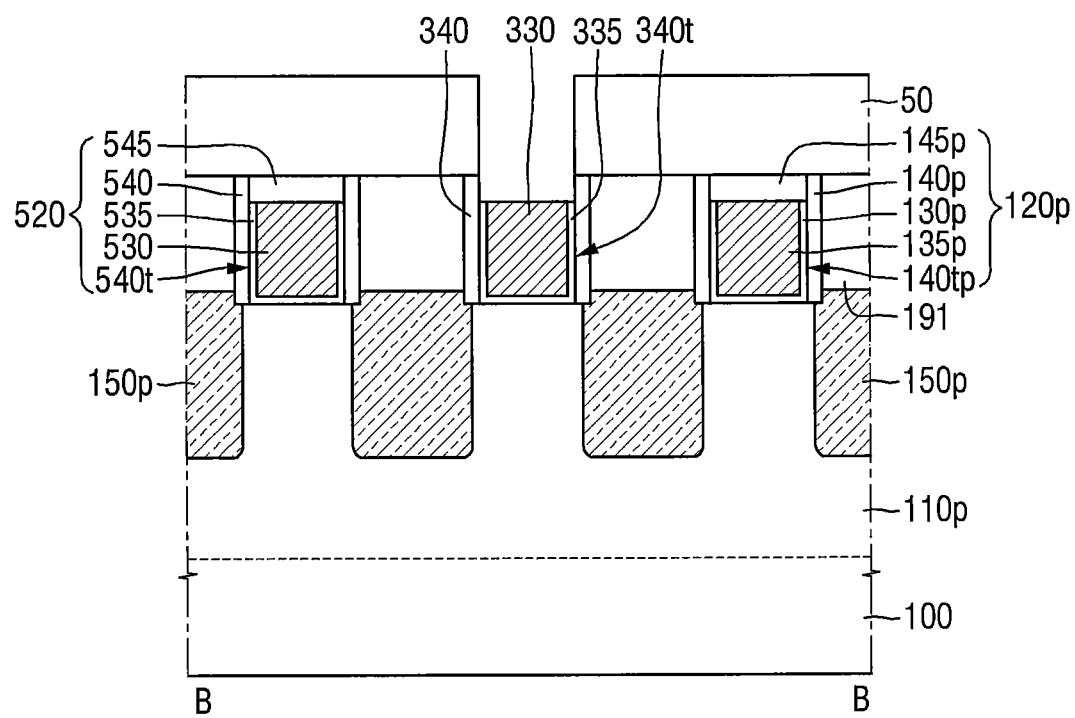

Referring to FIGS. 34 and 35, a hard mask pattern 50, which exposes a part of the pre-capping pattern 145p and a part of the third capping pattern 345 is formed on the lower interlayer insulation film 191.

At this time, as illustrated in FIG. 34, a part of the lower interlayer insulation film 191 may also be removed.

The exposed pre-capping pattern 145p and the third capping pattern 345 are removed using the hard mask pattern 50. The pre-capping pattern 145p is removed, and the pre gate electrode 130p and the pre gate insulation film 135p are exposed. The third capping pattern 345 is removed, and the third gate electrode 330 and the third gate insulation film 335 are exposed.

Figure 36:
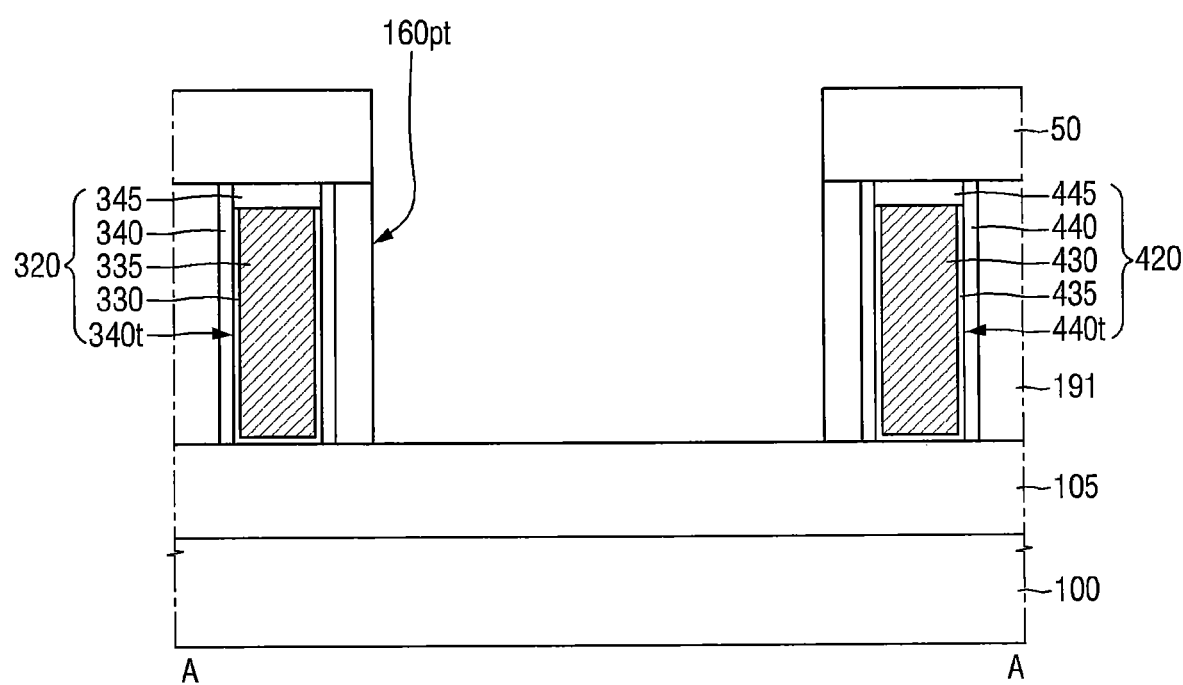
Figure 37:
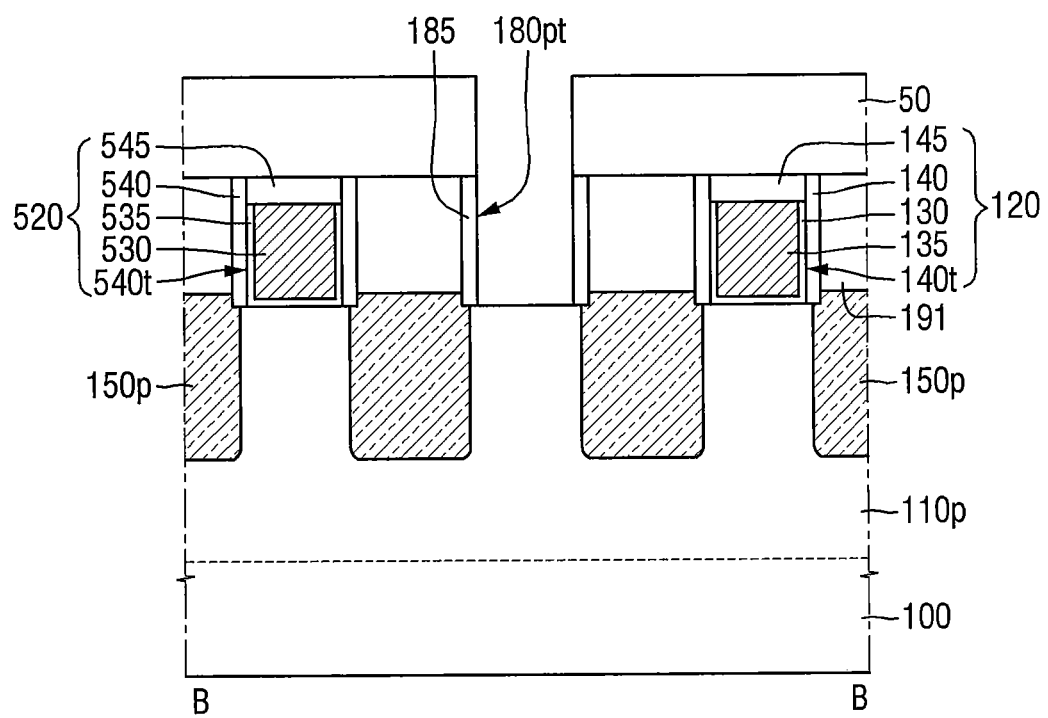

Referring to FIGS. 36 and 37, the exposed pre-gate electrode 130p and the pre gate insulation film 135p are removed to form a first pre-insulating trench 160pt on the field insulation film 105. By forming the first pre-insulating trench 160pt, the pre-gate structure 120p intersecting with the pre-fin type pattern 110p serves as the first gate structure 120.

The exposed third gate electrode 330 and the third gate insulation film 335 are removed to form a first pre-isolating trench 180pt. Although the first pre-isolating trench 180pt is illustrated as being defined by the dummy spacer 185, embodiments of the inventive concept are not limited thereto. While the first pre-isolating trench 180pt is formed, at least a part of the dummy spacer 185 may be removed based on the width opened by the hard mask pattern 50.

Figure 38:
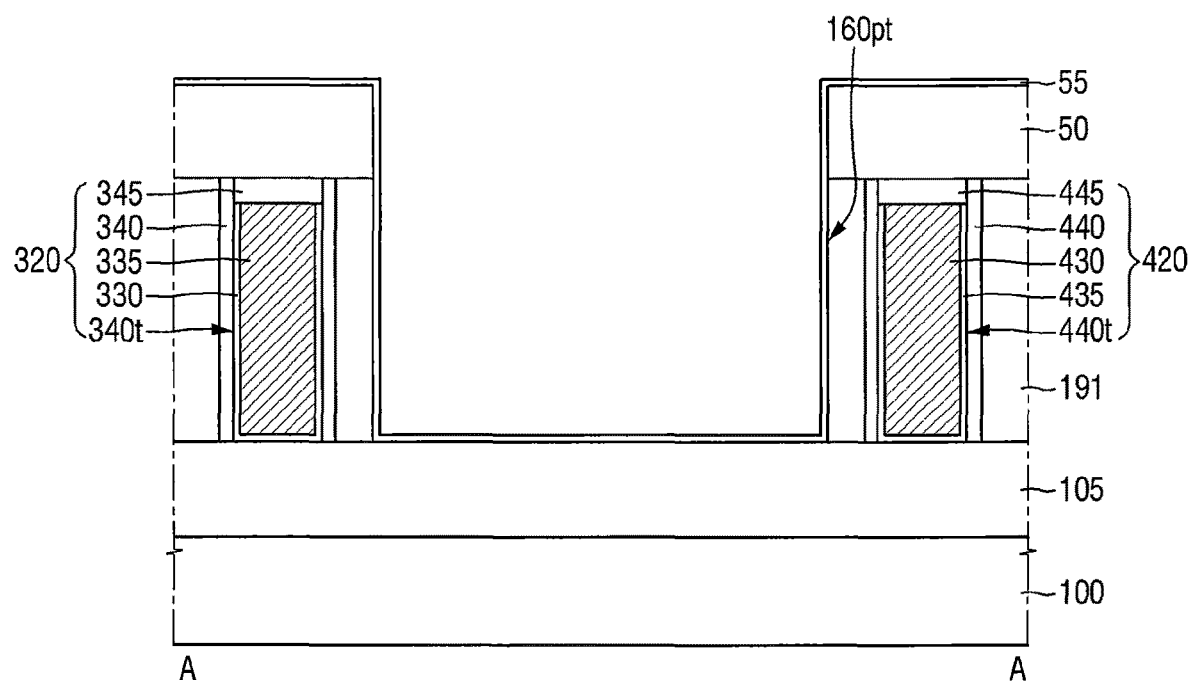
Figure 39:
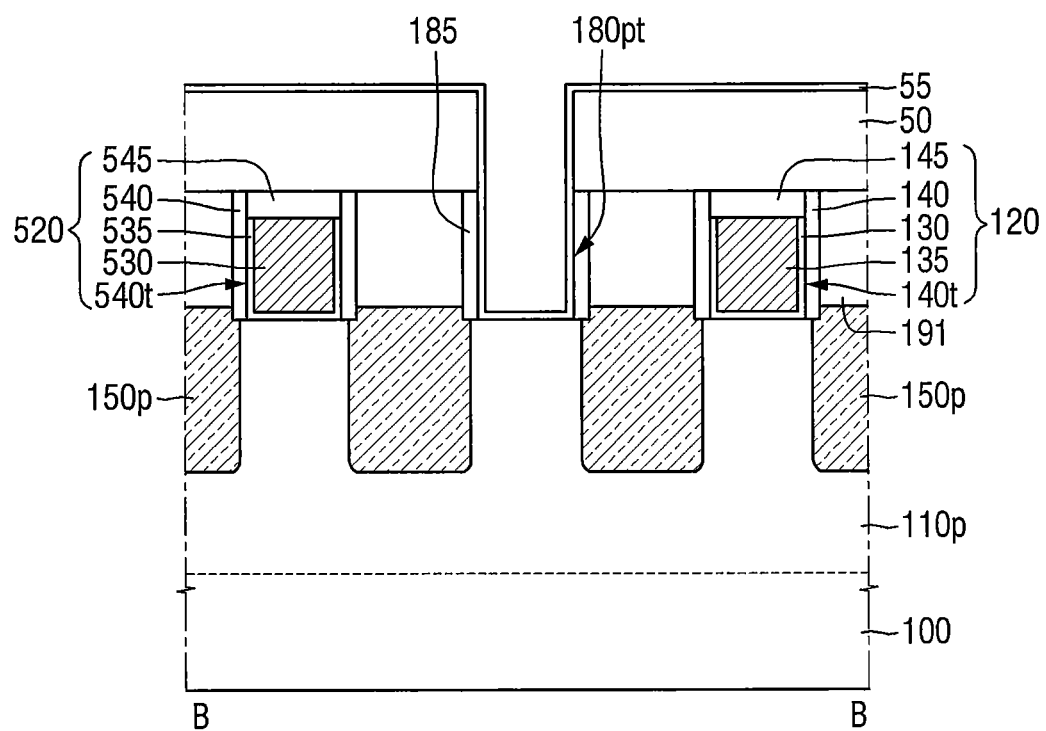

Referring to FIGS. 38 and 39, a first liner film 55 is formed along the sidewall and the bottom surface of the first pre-insulating trench 160pt and the sidewall and the bottom surface of the first pre-isolating trench 180pt.

The first liner film 55 is also formed on the upper surface of the hard mask pattern 50.

Figure 40:
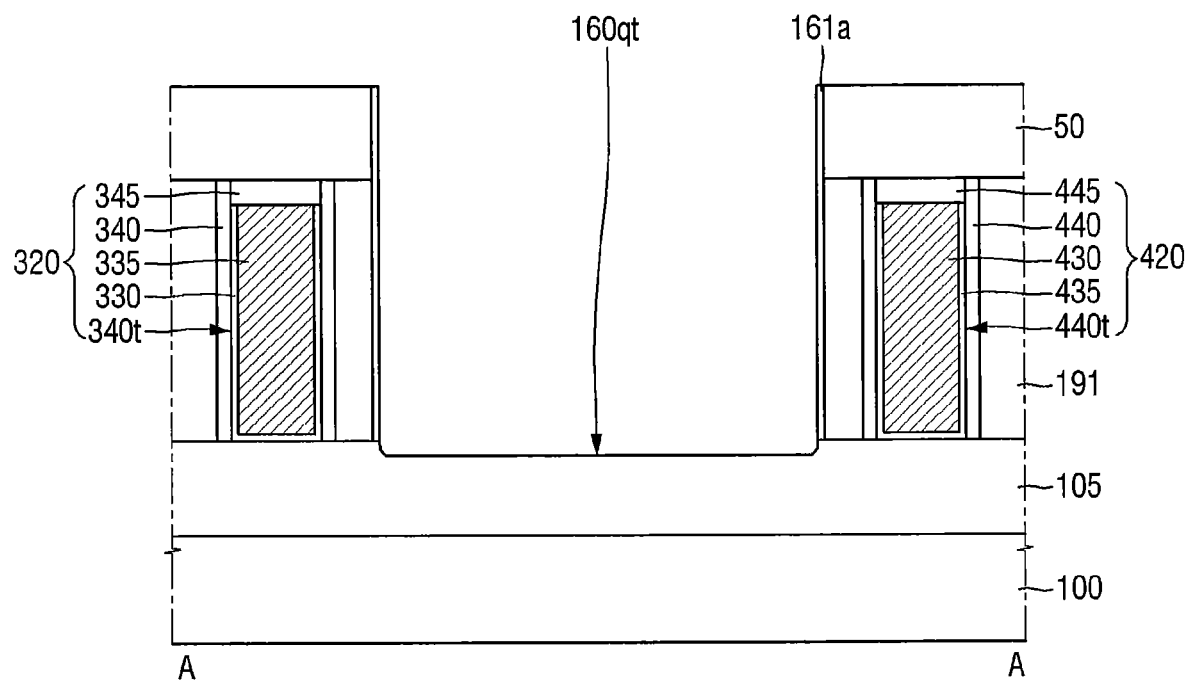
Figure 41:
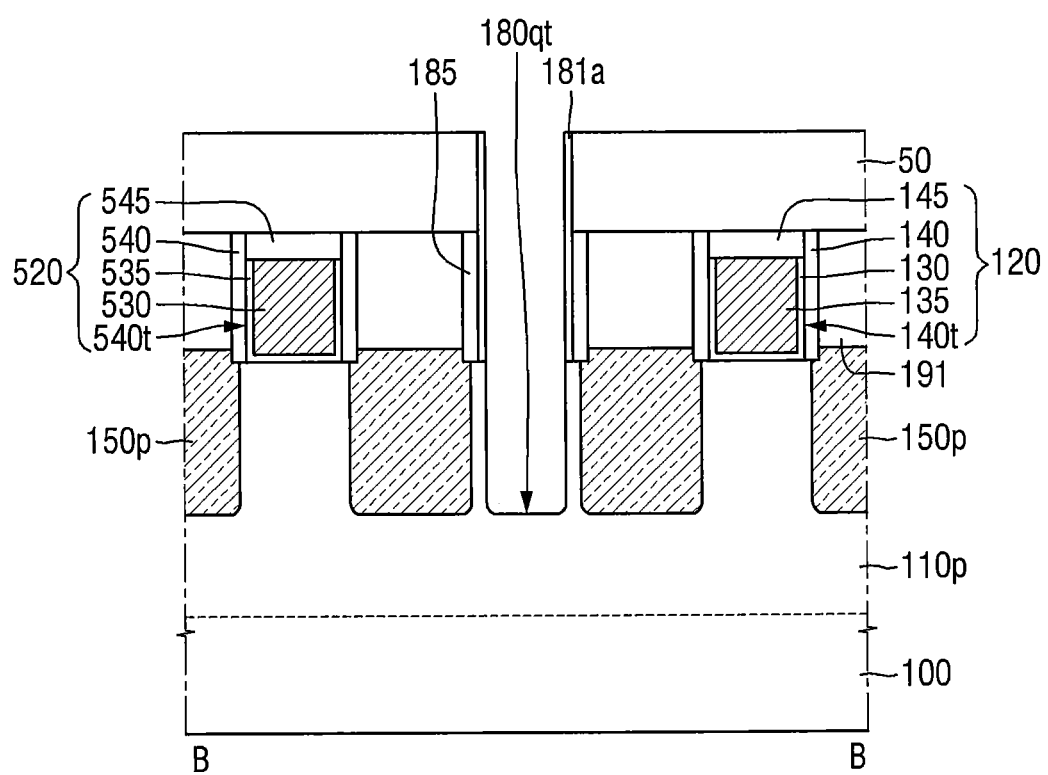

Referring to FIGS. 40 and 41, the first liner film 55 disposed on the bottom surface of the first pre-insulating trench 160pt, the bottom surface of the first pre-isolating trench 180pt, and the upper surface of the hard mask pattern 50 is etched using anisotropic etching.

Through the etching, a lower insulation liner 161a is formed on the field insulation film 105. Further, a lower isolation liner 181a is formed on the pre-fin type pattern 110p.

A part of the field insulation film 105 is removed using the hard mask pattern 50 and the lower insulation liner 161a as a mask. Thus, a second pre-insulating trench 160qt is formed. The lower insulation liner 161a is disposed on a part of the sidewall of the second pre-insulating trench 160qt.

A part of the pre-fin type pattern 110p is removed, using the hard mask pattern 50 and the lower isolation liner 181a as a mask. Therefore, the second pre isolating trench 180qt is formed. The lower isolation liner 181a is disposed on a part of the sidewall of the second pre-isolating trench 180qt.

Figure 42:
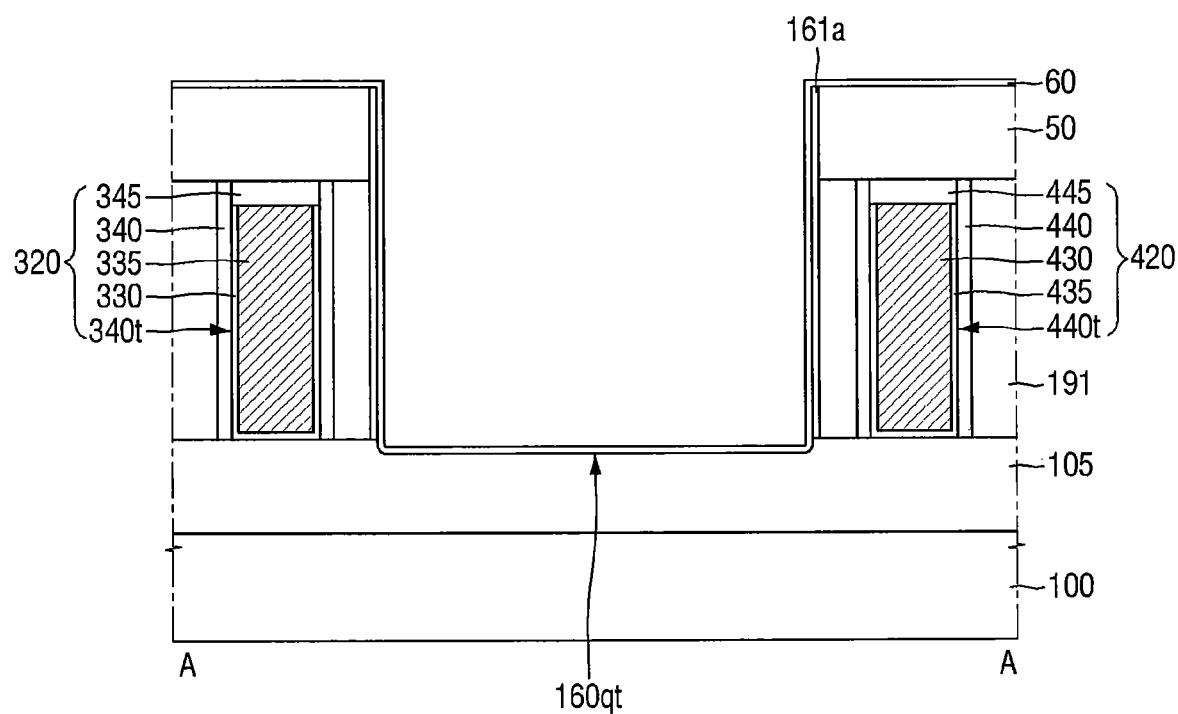
Figure 43:
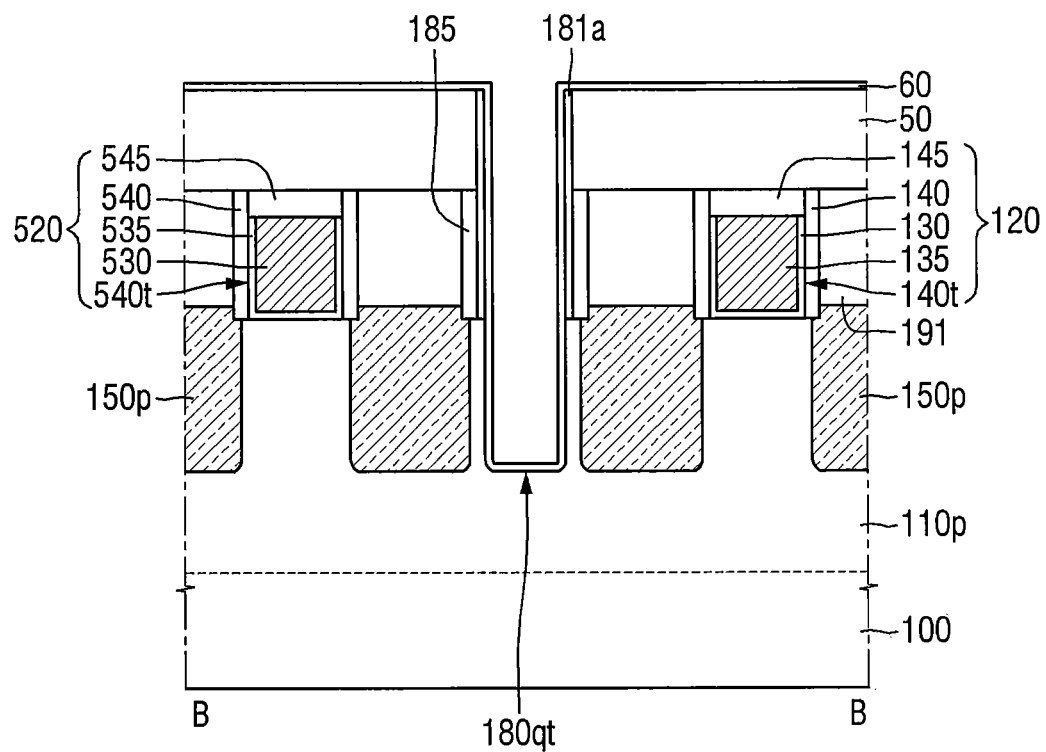

Referring to FIGS. 42 and 43, a second liner film 60 is formed along the sidewall and the bottom surface of the second pre-insulating trench 160qt and the sidewall and the bottom surface of the second pre-isolating trench 180qt. The second liner film 60 is formed on the lower insulation liner 161a and the lower isolation liner 181a.

The second liner film 60 is also formed on the upper surface of the hard mask pattern 50.

Figure 44:
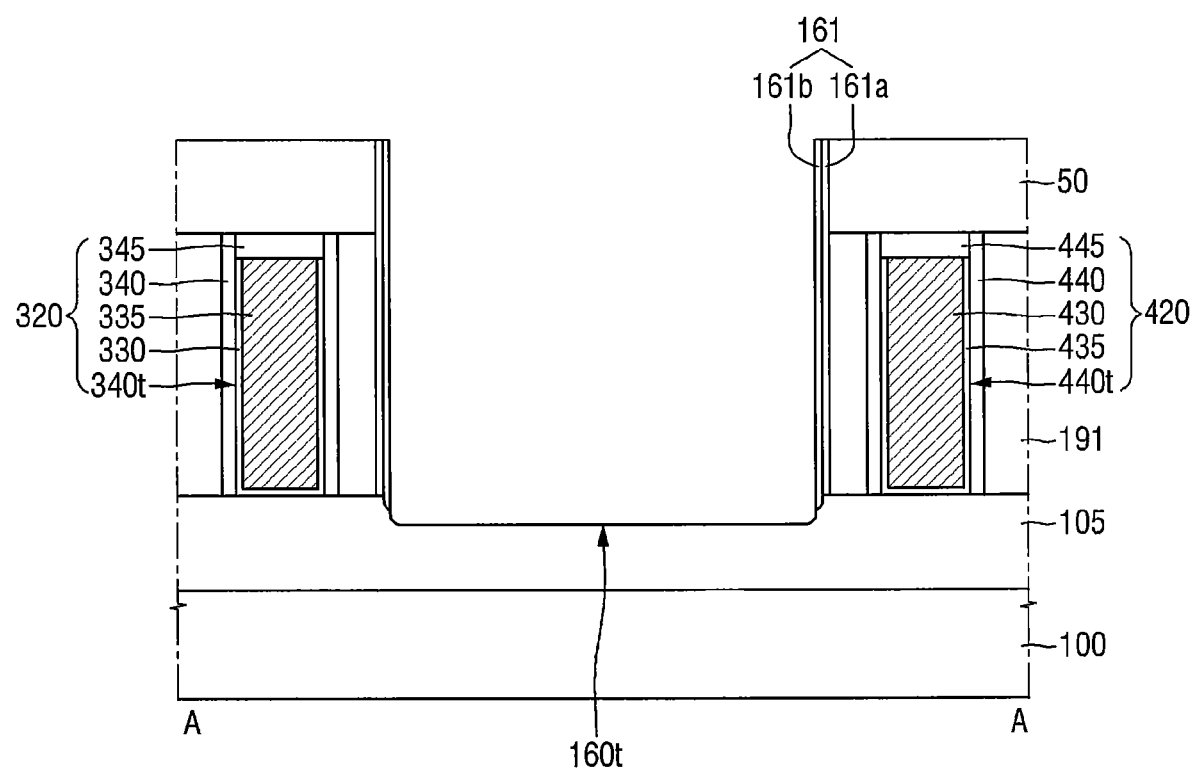
Figure 45:
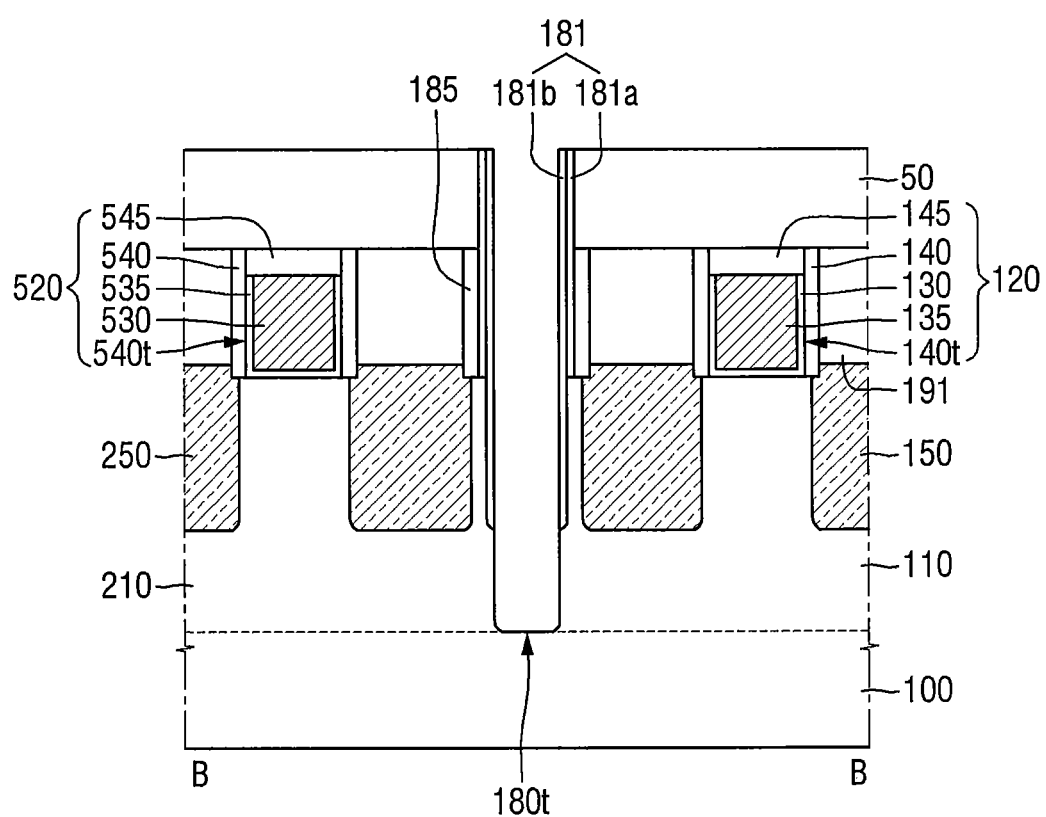

Referring to FIGS. 44 and 45, the second liner film 60 disposed on the bottom surface of the second pre-insulating trench 160qt, the bottom surface of the second pre-isolating trench 180qt and the upper surface of the hard mask pattern 50 is etched using the anisotropic etching.

Therefore, the upper insulation liner 161b is formed on the lower insulation liner 161a. Further, an upper isolation liner 181b is formed on the lower isolation liner 181a.

A first gate insulation liner 161 including the lower insulation liner 161a and the upper insulation liner 161b is formed. A device isolation liner 181 including the lower isolation liner 181a and the upper isolation liner 181b is formed.

A part of the field insulation film 105 is removed using the hard mask pattern 50 and the first gate insulation liner 161 as a mask. In this way, a first insulation trench 160t is formed. The first gate insulation liner 161 is disposed on a part of the sidewall of the first insulation trench 160t.

A part of the pre-fin type pattern 110p is removed, using the hard mask pattern 50 and the device isolation liner 181 as a mask. As a result, an isolating trench 180t is formed. The device isolation liner 181 is disposed on a part of the sidewall of the isolating trench 180t. The pre-fin type pattern 110p is isolated into the first fin type pattern 110 and the second fin type pattern 210 by the isolating trench 180t. Further, the pre-epitaxial pattern 150p is a first epitaxial pattern 150 on the first fin type pattern 110 and a second epitaxial pattern 250 on the second fin type pattern 210.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restric-

What is claimed is:

1. A semiconductor device comprising:
a first fin type pattern and a second fin type pattern, which are isolated from each other by an isolating trench, and extend in a first direction on a substrate, respectively;
a third fin type pattern, which is spaced apart from the first fin type pattern and the second fin type pattern in a second direction and extends in the first direction;
a field insulation film on a part of sidewalls of the first to third fin type patterns;
a device isolation structure, which extends in the second direction, and is in the isolating trench;
a gate insulation support, which extends in the first direction on the field insulation film between the first fin type pattern and the third fin type pattern;
a gate structure, which intersects the third fin type pattern, extends in the second direction, and is in contact with the gate insulation support,
wherein a height from the substrate to a bottom surface of the gate structure is greater than a height from the substrate to a bottom surface of the gate insulation support, and
wherein a height from an upper surface of the field insulation film to an upper surface of the gate insulation support is greater than a height from the upper surface of the field insulation film to an upper surface of the first fin type pattern.

2. The semiconductor device of claim 1, wherein a depth from the upper surface of the first fin type pattern to a bottom surface of the device isolation structure is greater than a depth from the upper surface of the first fin type pattern to the bottom surface of the gate insulation support.

3. The semiconductor device of claim 1, wherein a depth from the upper surface of the first fin type pattern to a bottom surface of the device isolation structure is equal to or greater than a height of the first fin type pattern.

4. The semiconductor device of claim 3, wherein the depth from the upper surface of the first fin type pattern to the bottom surface of the gate insulation support is less than the height of the first fin type pattern.

5. The semiconductor device of claim 1, wherein the gate insulation support and the device isolation structure are in direct contact with each other.

6. The semiconductor device of claim 1, wherein the gate structure includes a gate spacer, which defines a gate trench, and a high dielectric constant insulating film extending along a sidewall and a bottom surface of the gate trench,
wherein the high dielectric constant insulating film does not extend along a sidewall of the gate insulation support.

7. The semiconductor device of claim 1, wherein the gate insulation support comprises a gate insulation filling film, and a gate insulation liner on a sidewall of the gate insulation filling film, and
wherein the device isolation structure comprises a device isolation filling film, and a device isolation liner on the device isolation filling film.

8. The semiconductor device of claim 7, wherein the gate insulation liner comprises a same material as the device isolation liner.

9. The semiconductor device of claim 1, wherein the gate structure comprises a gate spacer, which defines a gate trench, a gate electrode, which is in a part of the gate trench, and a capping pattern, which is on the gate electrode in the gate trench.

10. The semiconductor device of claim 9, wherein the gate insulation support comprises a gate insulation filling film and a gate insulation liner extending between the gate insulation filling film and the capping pattern.

11. A semiconductor device comprising:
a first fin type pattern and a second fin type pattern, which are isolated from each other by an isolating trench and extend in a first direction on a substrate, respectively;
a third fin type pattern, which is spaced apart from the first fin type pattern and the second fin type pattern in a second direction and extends in the first direction;
a field insulation film, which is disposed on a part of sidewalls of the first, second, and third fin type patterns;
a device isolation structure comprising a stacked structure, which extends in the second direction and is in the isolating trench;
a gate insulation support comprising the stacked structure, which extends in the first direction on the field insulation film between the first fin type pattern and the third fin type pattern; and
a gate structure, which intersects the third fin type pattern, extends in the second direction, and is in contact with the gate insulation support,
wherein a height from an upper surface of the field insulation film to an upper surface of the gate insulation support is greater than a height from the upper surface of the field insulation film to an upper surface of the first fin type pattern.

12. The semiconductor device of claim 11, wherein the gate insulation support comprises a gate insulation filling film, and a gate insulation liner on a sidewall of the gate insulation filling film,
wherein the device isolation structure comprises a device isolation filling film and a device isolation liner on the device isolation filling film,
wherein the gate insulation liner comprises a same material as the device isolation liner.

13. The semiconductor device of claim 12, wherein the gate insulation liner comprises a lower insulation liner and an upper insulation liner on the lower insulation liner,
wherein the device isolation liner comprises a lower isolation liner and an upper isolation liner on the lower isolation liner,
wherein the lower insulation liner comprises a same material as the lower isolation liner, and
wherein the upper insulation liner comprises a same material as the upper isolation liner.

14. The semiconductor device of claim 12, wherein the gate insulation liner is not formed on a bottom surface of the gate insulation filling film, and
wherein the device isolation liner is not formed on at least a part of a bottom surface of the device isolation filling film.

15. The semiconductor device of claim 11, wherein a height from the substrate to a bottom surface of the gate structure is greater than a height from the substrate to a bottom surface of the gate insulation support.

16. The semiconductor device of claim 11, wherein a bottom surface of the gate insulation support is defined by the field insulation film.

17. The semiconductor device of claim 11, further comprising:

a connection spacer protruding from the upper surface of the field insulation film between the gate insulation support and the field insulation film,
wherein a height of the connection spacer is less than a height of the gate structure.

18. The semiconductor device of claim 11, wherein the gate insulation support comprises a first portion in contact with the gate structure, and a second portion in non-contact with the gate structure, the first portion and the second portion being separated in the first direction, and
wherein the semiconductor device further comprises an interlayer insulation film interposed between the second portion of the gate insulation support and the field insulation film.

19. A semiconductor device comprising:
a first fin type pattern and a second fin type pattern each extending in a first direction on a substrate;
a third fin type pattern spaced apart from the first fin type pattern and the second fin type pattern in a second direction and extending in the first direction;
a field insulation film on a part of sidewalls of the first, second, and third fin type patterns;
an isolating insulation pattern, which comprises a first isolation pattern extending in the first direction and a second isolation pattern extending in the second direction on the substrate, the first isolation pattern being on the field insulation film between the first fin type pattern and the third fin type pattern, and the second isolation pattern isolating the first fin type pattern and the second fin type pattern;
a first gate structure, which intersects the first fin type pattern, extends in the second direction, and is in contact with the first isolation pattern;
a second gate structure, which intersects the third fin type pattern, is arranged side by side with the first gate structure, and is in contact with the first isolation pattern,
wherein a depth from an upper surface of the first fin type pattern to a bottom surface of the second isolation pattern is greater than a depth from the upper surface of the first fin type pattern to a bottom surface of the first isolation pattern, and
wherein a height from an upper surface of the field insulation film to an upper surface of the first insulation pattern is greater than a height from the upper surface of the field insulation film to the upper surface of the first fin type pattern.

20. The semiconductor device of claim 19, wherein a height from the substrate to a bottom surface of the first gate structure is greater than a height from the substrate to the bottom surface of the first isolation pattern.

* * * * *